(12) United States Patent
Fukuo et al.

(10) Patent No.: US 10,734,400 B1
(45) Date of Patent: Aug. 4, 2020

(54) THREE-DIMENSIONAL MEMORY DEVICE INCLUDING BIT LINES BETWEEN MEMORY ELEMENTS AND AN UNDERLYING PERIPHERAL CIRCUIT AND METHODS OF MAKING THE SAME

(71) Applicant: SANDISK TECHNOLOGIES LLC, Addison, TX (US)

(72) Inventors: Noritaka Fukuo, Ofuna (JP); Masayuki Hiroi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/278,391

(22) Filed: Feb. 18, 2019

(51) Int. Cl.
| | | |
|---|---|---|
| *H01L 27/11524* | (2017.01) | |
| *H01L 27/1157* | (2017.01) | |
| *H01L 27/11582* | (2017.01) | |
| *H01L 27/11556* | (2017.01) | |
| *H01L 27/11529* | (2017.01) | |
| *H01L 27/11519* | (2017.01) | |
| *H01L 27/11575* | (2017.01) | |

(Continued)

(52) U.S. Cl.
CPC .... *H01L 27/11575* (2013.01); *H01L 21/7682* (2013.01); *H01L 21/76834* (2013.01); *H01L 23/5226* (2013.01); *H01L 23/5329* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11578* (2013.01); *H01L 27/11582* (2013.01); *H01L 27/11529* (2013.01); *H01L 27/11573* (2013.01)

(58) Field of Classification Search
CPC ......... H01L 27/11524; H01L 27/11529; H01L 27/11556; H01L 27/1157; H01L 27/11575; H01L 27/11578; H01L 27/11582
See application file for complete search history.

(56) References Cited

U.S. PATENT DOCUMENTS

| | | | |
|---|---|---|---|
| 5,915,167 | A | 6/1999 | Leedy |
| 9,530,790 | B1 | 12/2016 | Lu et al. |

(Continued)

OTHER PUBLICATIONS

U.S. Appl. No. 16/274,687, filed Feb. 13, 2019, Sandisk Technologies LLC.

*Primary Examiner* — Matthew E Warren
(74) *Attorney, Agent, or Firm* — The Marbury Law Group PLLC

(57) ABSTRACT

A three-dimensional semiconductor device includes bit lines formed in the lower-interconnect-level dielectric material layers located over a substrate, bit-line-connection via structures contacting a respective one of the bit lines, pillar-shaped drain regions contacting a respective one of the bit-line-connection via structures, an alternating stack of insulating layers and electrically conductive layers located over the pillar-shaped drain regions, and memory stack structures extending through the alternating stack. A source layer overlies the alternating stack, and is electrically connected to an upper end of each vertical semiconductor channel within a subset of the vertical semiconductor channels. Vertical bit line interconnections structures extending through the levels of the alternating stack may be eliminated by forming the bit lines underneath the alternating stack, and the footprint of the layout of the three-dimensional memory device may be reduced.

12 Claims, 38 Drawing Sheets

(51) Int. Cl.
*H01L 27/11578* (2017.01)
*H01L 27/11565* (2017.01)
*H01L 27/11548* (2017.01)
*H01L 23/522* (2006.01)
*H01L 23/532* (2006.01)
*H01L 21/768* (2006.01)
*H01L 27/11573* (2017.01)

(56) References Cited

U.S. PATENT DOCUMENTS

| | | | |
|---|---|---|---|
| 9,876,031 B1 * | 1/2018 | Shimizu | H01L 27/11582 |
| 9,935,050 B2 | 4/2018 | Dunga et al. | |
| 10,354,980 B1 * | 7/2019 | Mushiga | H01L 24/89 |
| 10,355,009 B1 * | 7/2019 | Kai | H01L 27/11582 |
| 2002/0054514 A1 | 5/2002 | Kajigaya et al. | |
| 2003/0031058 A1 | 2/2003 | Kajigaya et al. | |
| 2003/0123305 A1 | 7/2003 | Yang et al. | |
| 2003/0214022 A1 | 11/2003 | Yang et al. | |
| 2004/0240259 A1 | 12/2004 | Kajigaya et al. | |
| 2005/0179058 A1 | 8/2005 | Kajigaya et al. | |
| 2006/0120125 A1 | 6/2006 | Kajigaya et al. | |
| 2007/0242535 A1 | 10/2007 | Kajigaya et al. | |
| 2008/0205111 A1 | 8/2008 | Kajigaya et al. | |
| 2008/0284006 A1 | 11/2008 | Hong et al. | |
| 2010/0019215 A1 | 1/2010 | Lung et al. | |
| 2010/0172177 A1 | 7/2010 | Lee et al. | |
| 2010/0301304 A1 | 12/2010 | Chen et al. | |
| 2011/0097895 A1 | 4/2011 | Hong et al. | |
| 2013/0176782 A1 | 7/2013 | Lee et al. | |
| 2013/0267092 A1 | 10/2013 | Shin et al. | |
| 2014/0209849 A1 | 7/2014 | Okajima | |
| 2015/0009757 A1 | 1/2015 | Hu et al. | |
| 2016/0056210 A1 | 2/2016 | Takaki | |
| 2016/0148948 A1 * | 5/2016 | Kim | H01L 27/11582 257/324 |
| 2016/0240476 A1 | 8/2016 | Takahashi et al. | |
| 2017/0025354 A1 | 1/2017 | Watanabe et al. | |
| 2019/0221557 A1 * | 7/2019 | Kim | H01L 27/11565 |
| 2020/0051945 A1 * | 2/2020 | Pan | H01L 24/82 |

* cited by examiner

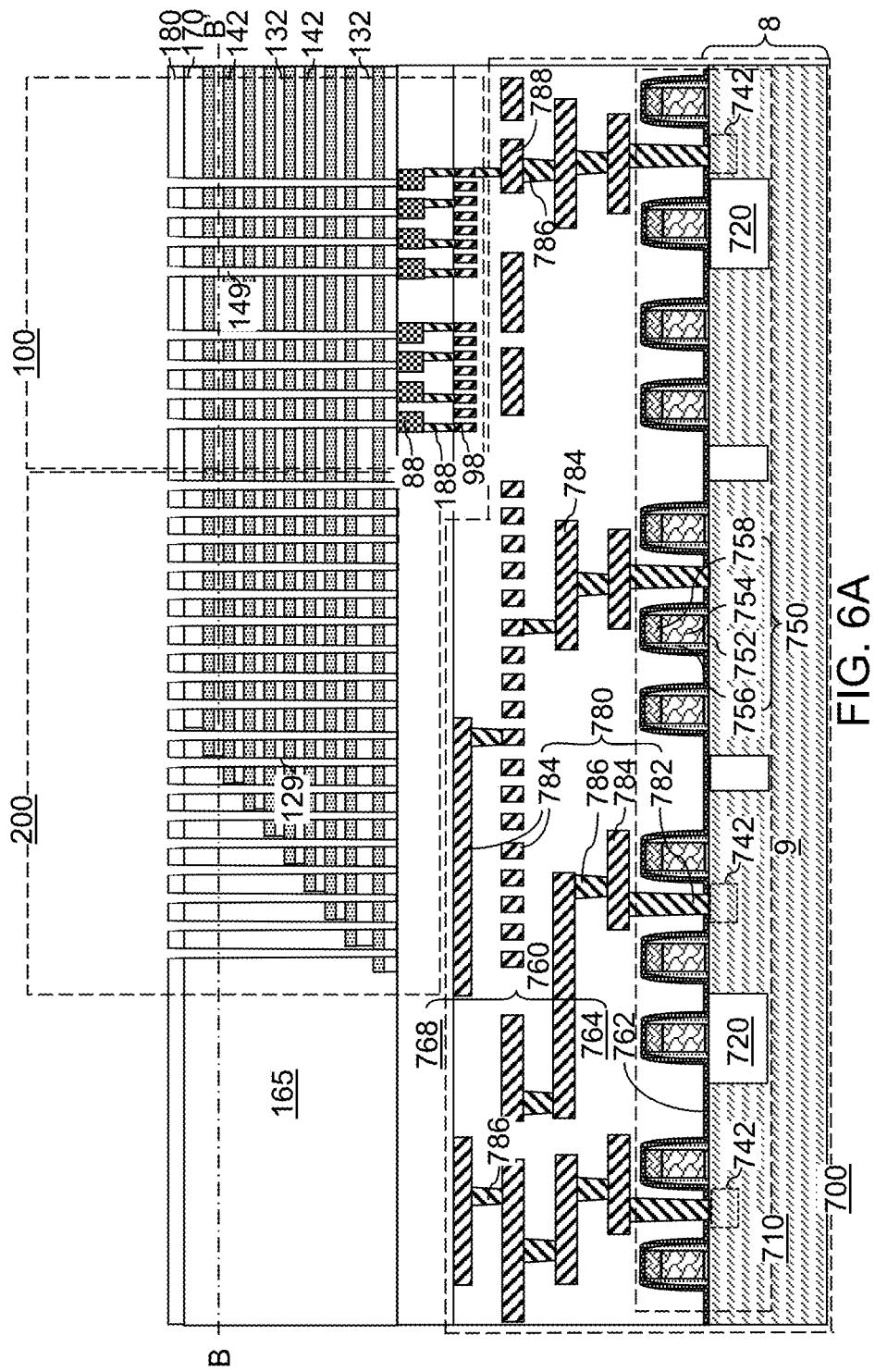

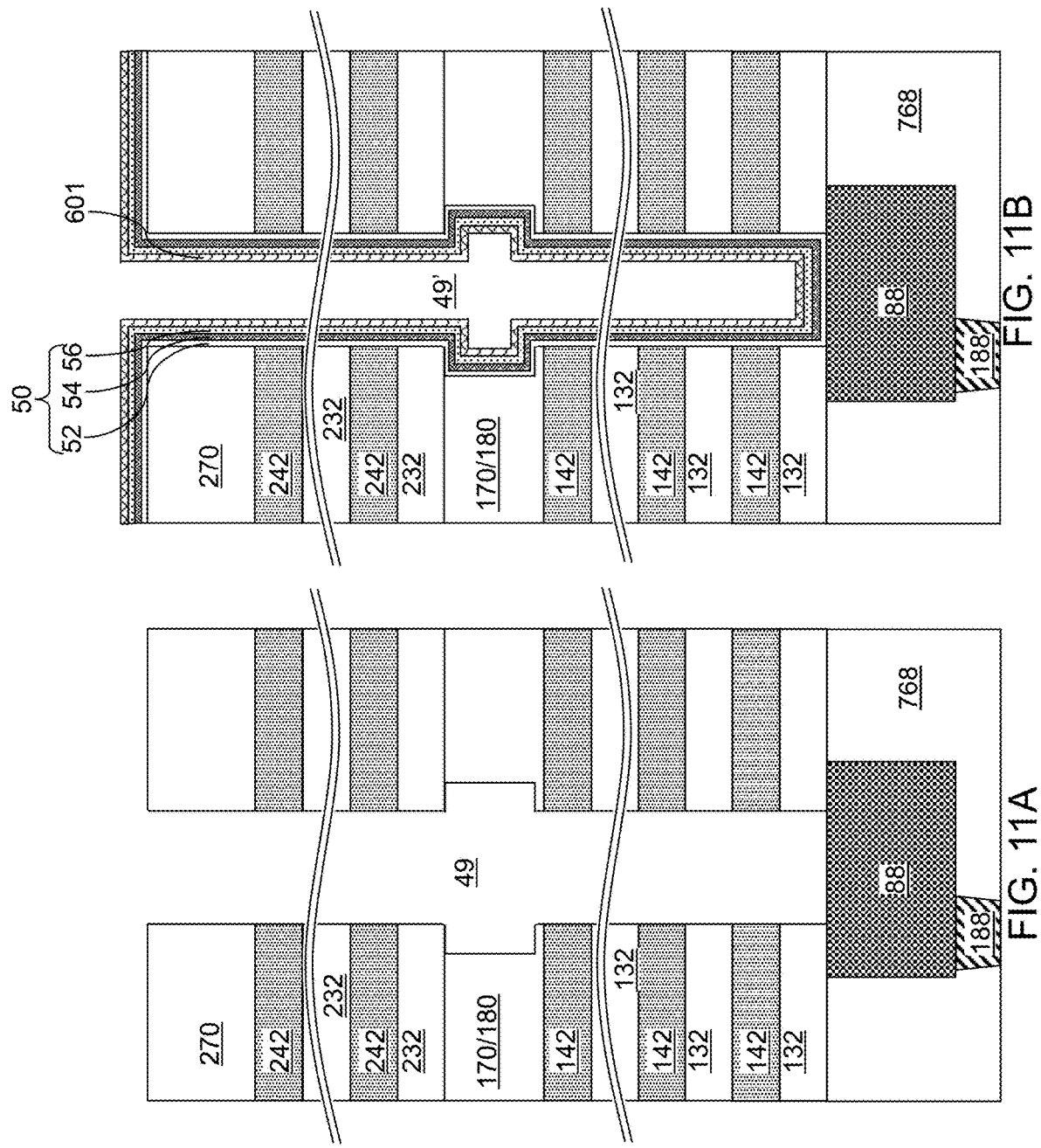

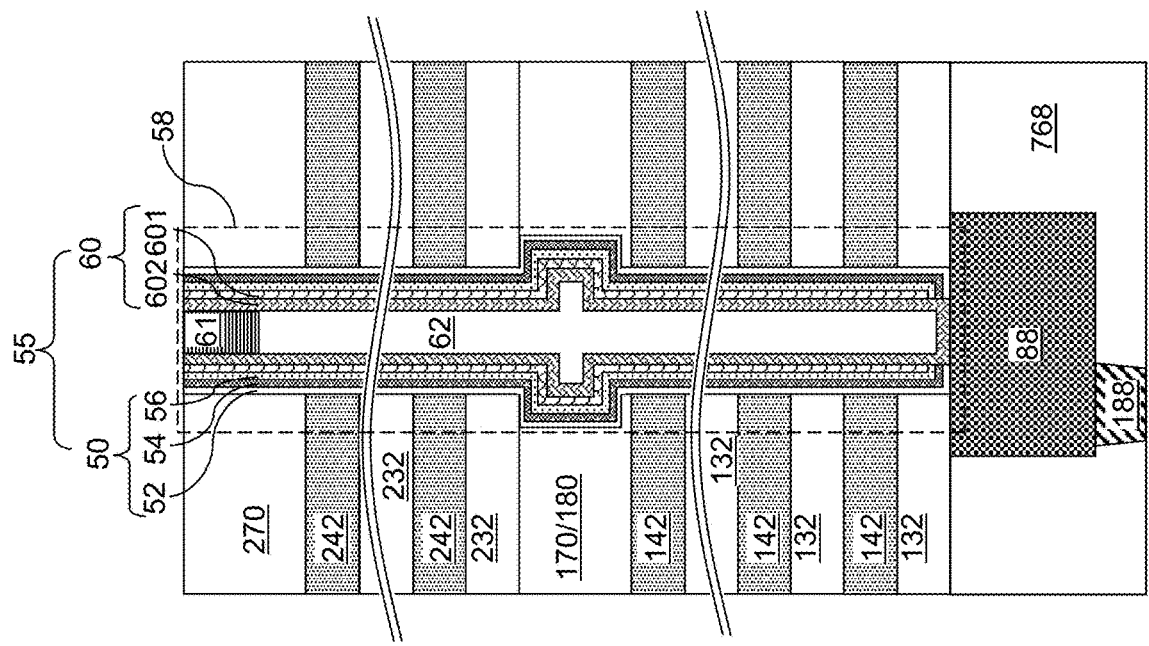
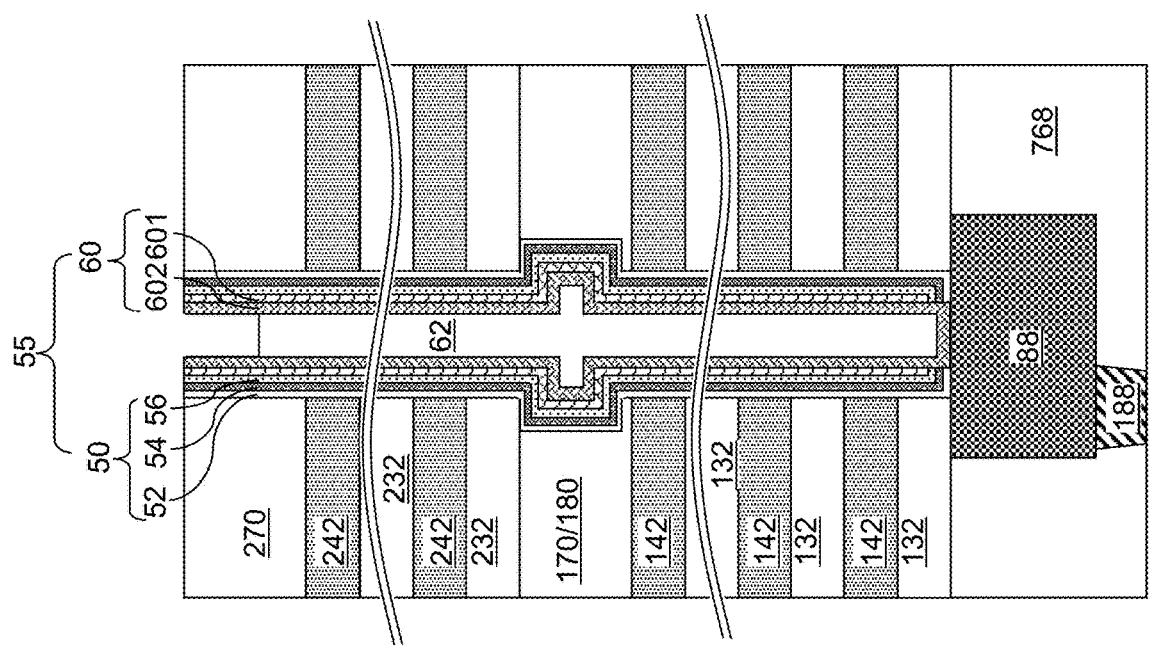
FIG. 11F
FIG. 11E

THREE-DIMENSIONAL MEMORY DEVICE INCLUDING BIT LINES BETWEEN MEMORY ELEMENTS AND AN UNDERLYING PERIPHERAL CIRCUIT AND METHODS OF MAKING THE SAME

FIELD

The present disclosure relates generally to the field of semiconductor devices, and specifically to a three-dimensional memory device including bit lines located between memory elements and an underlying peripheral circuit and methods of making the same.

BACKGROUND

Recently, ultra-high-density storage devices using three-dimensional (3D) memory stack structures have been proposed. For example, a three-dimensional NAND memory device may use an array of an alternating stack of insulating materials and spacer material layers that is formed over a substrate containing peripheral devices (e.g., driver/logic circuits). The spacer material layers may be formed as electrically conductive layers, or may be formed as sacrificial material layers that are subsequently replaced with electrically conductive layers. Memory openings are formed through the alternating stack, and are filled with memory stack structures, each of which includes a vertical stack of memory elements and a vertical semiconductor channel.

Typically, vertical semiconductor channels of the memory stack structures are electrically connected to a source line that underlies the alternating stack. In some configurations, the vertical semiconductor channels are connected to the source line through pedestal channel structures that are formed at the bottom of each memory opening. In some other configurations, the source line is formed by replacement of a buried sacrificial material layer that underlies the alternating stack.

SUMMARY

According to an aspect of the present disclosure, a three-dimensional semiconductor device is provided, which comprises: bit lines formed in the lower-interconnect-level dielectric material layers, laterally spaced apart along a first horizontal direction, and laterally extending along a second horizontal direction that is perpendicular to the first horizontal direction, and located over a substrate; bit-line-connection via structures contacting a top surface of a respective one of the bit lines and formed in a via-level dielectric layer; pillar-shaped drain regions contacting a respective one of the bit-line-connection via structures; an alternating stack of insulating layers and electrically conductive layers located over the pillar-shaped drain regions; memory opening fill structures vertically extending through the alternating stack and including a respective memory stack structure that contains a respective vertical semiconductor channel and a respective vertical stack of memory elements; a source layer overlying the alternating stack and electrically connected to an upper end of each vertical semiconductor channel within a subset of the vertical semiconductor channels; and field effect transistors located on or over the top surface of the substrate, wherein the bit lines are located between the field effect transistors and the memory opening fill structures.

According to another aspect of the present disclosure, a method of forming a three-dimensional semiconductor device is provided, which comprises forming field effect transistors on or over a top surface of the substrate; forming bit lines formed in the lower-interconnect-level dielectric material layers over the field effect transistors, wherein the bit lines are laterally spaced apart along a first horizontal direction, and laterally extend a long a second horizontal direction that is perpendicular to the first horizontal direction; forming bit-line-connection via structures formed in a via-level dielectric layer on a top surface of a respective one of the bit lines; forming pillar-shaped drain regions on a respective one of the bit-line-connection via structures; forming an alternating stack of insulating layers and spacer material layers over the pillar-shaped drain regions, wherein the spacer material layers are formed as, or are subsequently replaced with, electrically conductive layers; forming memory openings through the alternating stack on a respective one of the pillar-shaped drain regions; forming memory opening fill structures including a respective memory stack structure that contains a respective vertical semiconductor channel and a respective vertical stack of memory elements in the memory openings; and forming a source layer over the alternating stack, wherein the source layer is electrically connected to an upper end of each vertical semiconductor channel within a subset of the vertical semiconductor channels.

BRIEF DESCRIPTION OF THE DRAWINGS

FIG. 6A is a vertical cross-sectional view of the exemplary structure after formation of first-tier memory openings and first-tier support openings according to an embodiment of the present disclosure.

FIGS. 11A-11F illustrate sequential vertical cross-sectional views of a memory opening during formation of a memory opening fill structure according to an embodiment of the present disclosure.

DETAILED DESCRIPTION

Figure 1A:
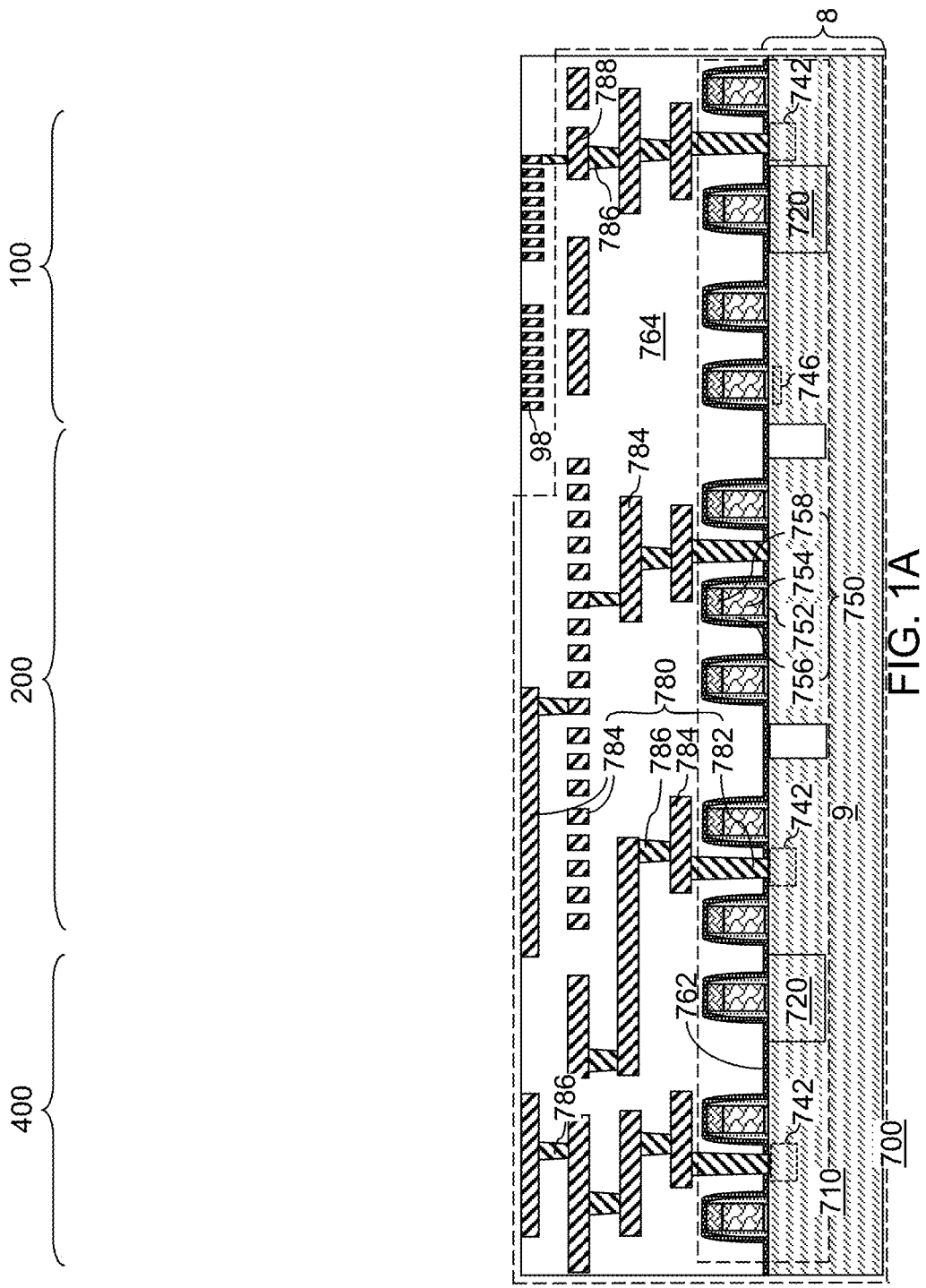
FIG. 1A is a vertical cross-sectional view of an exemplary structure after formation of field effect transistors, lower-interconnect-level dielectric material layers, lower-level metal interconnect structures, and bit lines on a semiconductor substrate according to an embodiment of the present disclosure.

As three-dimensional memory devices scale to smaller device dimensions, the device area for peripheral devices (which may be referred to interchangeably as driver devices, driver circuits, logic circuitry, logic devices, peripheral circuits, etc.) may take up a significant portion of the total chip area. The peripheral logic circuitry provides control of the various nodes of the memory devices. Manufacture of a three-dimensional memory array typically involves many high temperature processing steps, such as activation anneals and high temperature layer deposition steps. Such high temperature processing steps have an adverse impact on logic devices formed on a same substrate as the three-dimensional memory array. However, high performance peripheral devices are necessary to provide high performance for a three-dimensional memory device.

A three-dimensional NAND memory device may use an array of an alternating stack of insulating materials and spacer material layers that is formed over a substrate containing peripheral devices (e.g., driver/logic circuits). The spacer material layers may be formed as electrically conductive layers, or may be formed as sacrificial material layers that are subsequently replaced with electrically conductive layers. Memory openings are formed through the alternating stack, and are filled with memory stack structures, each of which includes a vertical stack of memory elements and a vertical semiconductor channel. Typically, vertical semiconductor channels of the memory stack structures are electrically connected to each of the source lines. In some configurations, the vertical semiconductor channels are connected to the source line through pedestal channel structures that are formed at the bottom of each memory opening. In some other configurations, the source line is formed by replacement of a buried sacrificial material layer that underlies the alternating stack. As the number of electrically conductive layers increases in the alternating stack, however, process control for formation of pedestal channel portions and replacement of the buried sacrificial material layer becomes difficult due to high aspect ratios of the memory openings or access trenches. A three-dimensional memory device is desired which does not require challenging processes that modify structures at the bottom of high aspect ratio openings through the alternating stack.

The embodiments of the present disclosure provide a three-dimensional memory device including bit lines located between memory elements and an underlying peripheral circuit and methods of making the same, the various aspects of which are described herein in detail. The embodiments of the present disclosure may be used to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are used merely to identify similar elements, and different ordinals may be used across the specification and the claims of the instant disclosure. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
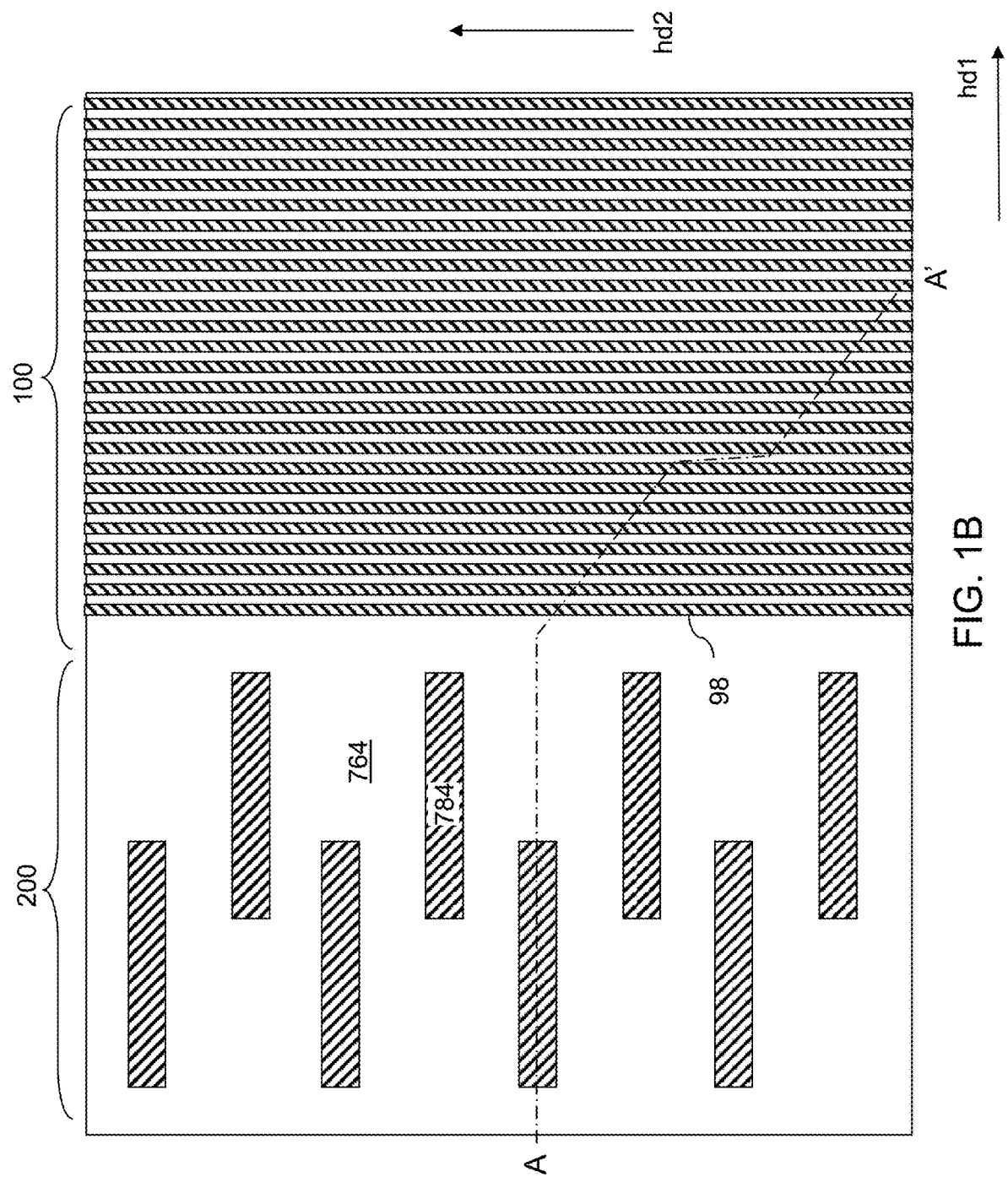
FIG. 1B is a top-down view of the exemplary structure of FIG. 1A. The hinged vertical plane A-A' is the plane of the vertical cross-sectional view of FIG. 1A.

Referring to FIGS. 1A and 1B, an exemplary structure according to an embodiment of the present disclosure is illustrated. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices. The dielectric material layers may include, for example, a dielectric liner 762 (such as a silicon nitride liner that blocks diffusion of mobile ions and/or apply appropriate stress to underlying structures) and lower-interconnect-level dielectric material layers 764 that overlie the dielectric liner 762.

The lower-interconnect-level dielectric material layers 764 function as a matrix for lower-level metal interconnect structures 780 that provide electrical wiring to and from the various nodes of the semiconductor devices 710 and landing pads for through-memory-level contact via structures to be subsequently formed. The lower-level metal interconnect structures 780 may be formed within the lower-interconnect-level dielectric material layers 764. The lower-interconnect-level dielectric material layers 764 may be a plurality of dielectric material layers in which various elements of the lower-level metal interconnect structures 780 are sequentially formed. Each dielectric material layer selected from the lower-interconnect-level dielectric material layers 764 may include any of doped silicate glass, undoped silicate glass, organosilicate glass, silicon nitride, silicon oxynitride, and dielectric metal oxides (such as aluminum oxide). In one embodiment, the lower-interconnect-level dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), lower-level metal line structures 784, lower-level metal via structures 786, and bit-line-connection metal line structures 788.

Bit lines 98 may be formed at the topmost level of the lower-level metal line structures 784. A three-dimensional array of memory elements is subsequently formed within the areas of the bit lines 98. Thus, the region in which the bit lines are formed are herein referred to as a memory array region 100. A region adjacent to the memory array region 100 is subsequently used to form stepped surfaces of an alternating stack of insulating layers and electrically conductive layers, and is herein referred to as a staircase region 200. A peripheral region 400 may be provided adjacent to the staircase region 200. The peripheral region 400 includes structures for forming electrical connections between semiconductor devices 710 and memory devices to be subsequently formed thereupon. The bit-line-connection metal line structures 788 include metal lines that are electrically connected to the bit lines 98 and used as components of electrically conductive paths between a respective bit line 98 and a respective one of the semiconductor devices 710. The bit lines 98 may be formed on a respective one of the lower-level metal via structures 786. The bit lines 98 may be parallel metal line structures that are laterally spaced apart along the first horizontal direction hd1 with a uniform pitch (which is herein referred to as a bit line pitch) and laterally extend along a second horizontal direction hd2 that is perpendicular to the first horizontal direction hd1.

Each of the lower-level metal interconnect structures 780 may include a metallic nitride liner and a metal fill structure. Topmost surfaces of the bit lines 98 and the topmost ones of the lower-level metal line structures 784 may be formed within a same horizontal plane, which may, or may not, include a topmost surface of the lower-interconnect-level dielectric material layers 764. The region of the semiconductor devices 710 and the combination of the lower-interconnect-level dielectric material layers 764 and the lower-level metal interconnect structures 780 is herein referred to a peripheral device region 700, over which a memory-level assembly is subsequently formed. The lower-level metal interconnect structures 780 may be electrically connected to active nodes (e.g., transistor active regions 742 or gate electrodes 754) of the semiconductor devices 710 (e.g., CMOS devices), and are located at the level of the lower-interconnect-level dielectric material layers 764.

The semiconductor devices 710 include field effect transistors located on a top surface of the substrate 8. The semiconductor devices 710 comprise a peripheral circuitry for a three-dimensional array of memory elements to be subsequently formed. The peripheral circuitry may include a word line driver circuit and a bit line driver circuit located on the top surface of the substrate 8. The lower-level metal interconnect structures 780 located in the lower-interconnect-level dielectric material layers 764 are electrically connected to the field effect transistors. The bit lines 98 are formed in the lower-interconnect-level dielectric material layers 764. The bit lines 98 are electrically connected to a subset of the field effect transistors that comprises bit line drivers through a subset of the lower-level metal interconnect structures 780.

Figure 1C:
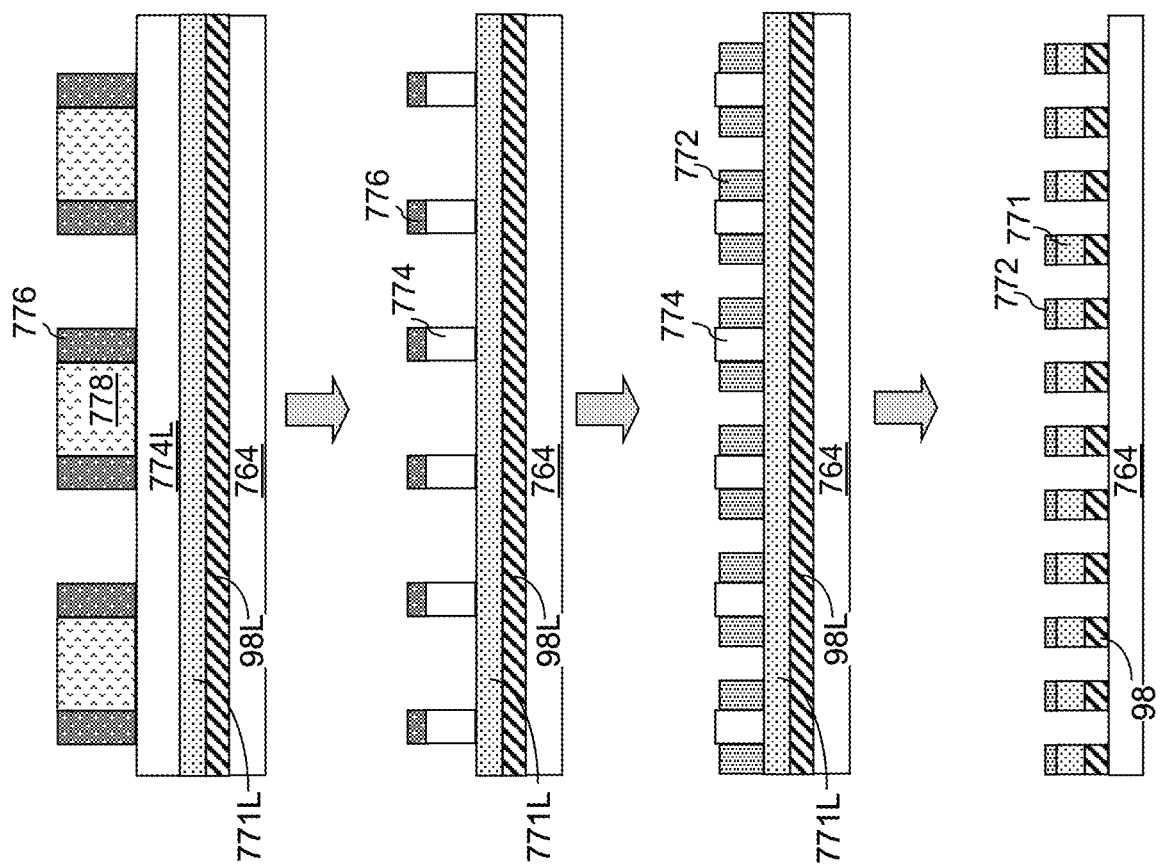
FIG. 1C illustrate sequential vertical cross-sectional views of a region of the exemplary structure during formation of the bit lines of FIG. 1A

Referring to FIG. 1C, an exemplary processing sequence for forming the bit lines 98 of FIGS. 1A and 1B is illustrated. A bit line material layer 98L may be deposited on a physically exposed planar surface of the lower-interconnect-level dielectric material layers 764. The bit line material layer 98L may include, for example, a vertical stack of a metallic liner material (such as TiN, TaN, or WN) and at least one metal (such as Cu, W, Mo, Ru, and/or Co).

At least one pattern transfer material layer 771L may be deposited over the bit line material layer 98L. The at least one pattern transfer material layer 771L includes at least one material that may transfer a lithographic pattern with high pattern fidelity, e.g., without generating line edge roughening. For example, the at least one pattern transfer material layer 771L may include a layer stack including, from bottom to top, an undoped silicate glass layer and an amorphous silicon layer.

An organic planarization layer (OPL) 774L may be deposited over the at least one pattern transfer material layer 771L. The OPL 774L contains a self-planarizing organic material that includes carbon, hydrogen, oxygen, and optionally nitrogen, fluorine, and silicon. In one embodiment, the self-planarizing organic material may be a polymer with sufficiently low viscosity so that the top surface of the applied polymer forms a planar horizontal surface. In one embodiment, the OPL 774L may include a transparent organic polymer. The OPL 774L may include a $C_xH_y$ polymer. Non-limiting examples of materials that may be used for the OPL 774L include, but are not limited to, CHM701B (commercially available from Cheil Chemical Co., Ltd.), HM8006 and HM8014 (commercially available from JSR Corporation), and ODL-102 and ODL-401 (commercially available from ShinEtsu Chemical, Co., Ltd.). The OPL 774L may be applied, for example, by spin-coating. In one embodiment, the thickness of the OPL 774L may be from about 30 nm to about 200 nm, although lesser and greater thicknesses may also be used.

A photoresist material may be applied over the OPL 774L, and may be lithographically patterned with a line and space pattern to form photoresist line structures 778 that laterally extend a horizontal direction (such as the second horizontal direction hd2 illustrated in FIG. 1B). In one embodiment, the photoresist line structures 778 may be formed as a one-dimensional periodic array of line structures that are repeated along a horizontal direction (such as the first horizontal direction hd1 illustrated in FIG. 1B) with a minimum lithographic pitch for a deep ultraviolet lithographic exposure tool or with a lithographic pitch available through extreme ultraviolet lithographic exposure tool. For example, the pitch of the photoresist line structures 778 may be in a range from 20 nm to 60 nm.

Spacer line structures 776 may be formed on the sidewalls of the photoresist line structures 778 by conformal deposition and anisotropic etch of a conformal spacer material layer. The spacer line structures 776 includes a material that may be used as an etch mask material for the OPL 774L. For example, the conformal spacer material layer may include a low temperature oxide material that may be deposited at a temperature in a range from 150 degrees Celsius to 300 degrees Celsius by plasma enhanced chemical vapor deposition. In one embodiment, the spacer line structures 776 may include silicon oxide or silicon nitride. The photoresist line structures 778 may be removed selective to the spacer line structures 776 and the OPL 774L, for example, by ashing.

An anisotropic etch process is performed, which etches the materials of the OPL 774L selective to the material of the spacer line structures 776. The OPL 774L is patterned into organic planarization material portions 774. Each organic planarization material portion 774 may have substantially the same area as an overlying spacer line structure 776. All, or a predominant portion, of each spacer line structure 776 may be consumed during the transfer of the pattern in the spacer line structures 776 through the OPL 774L and patterning of the OPL 774L into the organic planarization material portions 774. The lateral dimensions of the photoresist line structures 778 and the spacer line structures 776 may be selected such that the organic planarization material portions 774 are formed as a one-dimensional periodic array having a periodic pitch that is one-half of the pitch of the photoresist line structures 778. Generally, this condition may be satisfied by setting the thickness of the spacer line structures 776 such that the width of each photoresist line structure 778 is the same as the lateral width of a gap between a neighboring pair of spacer line structures 776. A top surface of the at least one pattern transfer material layer 771L is physically exposed between each neighboring pair of organic planarization material portions 774.

A conformal template material layer may be deposited over the organic planarization material portions 774. The conformal template material layer includes a material that may be used as an etch mask at least for an upper material layer within the at least one pattern transfer material layer 771L. For example, if the at least one pattern transfer material layer 771L contains a layer stack including, from bottom to top, an undoped silicate glass layer and an amorphous silicon layer, the conformal template material layer may include low temperature oxide (silicon oxide) that may be subsequent used as an etch mask material for patterning the amorphous silicon layer. An anisotropic etch process may be performed to remove horizontal portions of the conformal template material layer selective to the at least one pattern transfer material layer 771L (e.g., selective to the amorphous silicon layer). Each remaining vertical portion of the conformal template material layer constitutes a template line structure 772 that laterally extend along a horizontal direction (such as the second horizontal direction hd2 in FIG. 1B). The lateral dimensions of the template line structures 772 and the organic planarization material portions 774 may be selected such that the template line structures 772 are formed as a one-dimensional periodic array having a periodic pitch that is one-quarter of the pitch of the photoresist line structures 778. Generally, this condition may be satisfied by setting the thickness of the template line structure 772 such that the width of each organic planarization material portion 774 is the same as the lateral width of a gap between a neighboring pair of template line structures 772. A top surface of the at least one pattern transfer material layer 771L is physically exposed between each neighboring pair of organic planarization material portions 774.

The organic planarization material portions 774 may be removed selective to the template line structures 772 by an anisotropic etch process. The pattern in the template line structures 772 may be subsequently transferred through the at least one pattern transfer material layer 771L by an anisotropic etch process. If the at least one pattern transfer material layer 771L contains a layer stack including, from bottom to top, an undoped silicate glass layer and an amorphous silicon layer, the anisotropic etch process may sequentially etch through the physically exposed portions of the amorphous silicon layer and the undoped silicate glass layer. All, or a predominant portion, of each template line structure 772 may be consumed during the pattern transfer through the at least one pattern transfer material layer 771L by the anisotropic etch process. Each remaining discrete portion of the at least one pattern transfer material layer 771L constitutes pattern transfer line structures 771 that laterally extend along a horizontal direction (such as the second horizontal direction hd2 in FIG. 1B).

A subsequent step of the anisotropic etch process may use the pattern transfer line structures 771 (and any remaining portion of the template line structures 771, if any) as an etch mask to pattern the bit line material layer 98L into the bit lines 98. Optionally, a dielectric material layer that is incorporated into the lower-interconnect-level dielectric material layers 764 may be formed between the bit lines 98. In this case, the dielectric material layer may be planarized to provide a top surface that is coplanar with the top surfaces of the bit lines 98. Alternatively, gaps may be present between the bit lines 98 until a subsequent anisotropic deposition of a dielectric material for forming a via-level dielectric layer. Remaining portions of the pattern transfer line structures 771 and any template line structure 772, if present, are removed selective to the bit lines 98 by an anisotropic etch process.

Referring back to FIGS. 1A and 1B, the bit lines 98 may have the bit line pitch along the first horizontal direction hd1. In one embodiment, the bit line pitch hd1 may be one-quarter of the pitch of the patterned photoresist line structures 778, which may use a minimum lithographic pitch of deep ultraviolet lithographic exposure tool or a pitch of an extreme ultraviolet lithographic exposure tool. Thus, the bit lines 98 may be formed with a sub-lithographic pitch, which is necessary to provide a one-dimensional periodic array of high density bit lines 98 that provides a high density three-dimensional array of memory elements to be subsequently fabricated.

Figure 2A:
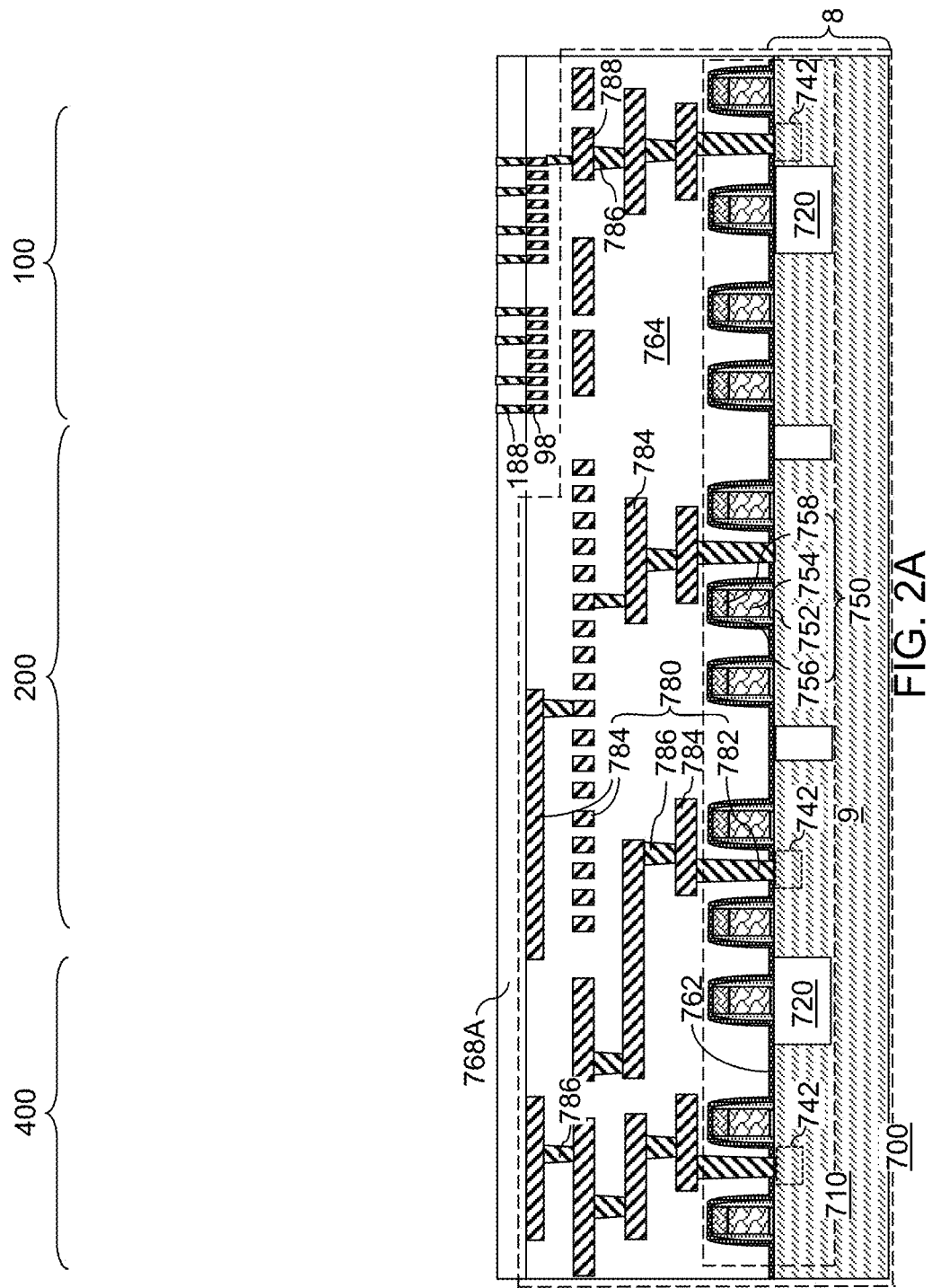
FIG. 2A is a vertical cross-sectional view of an exemplary structure after formation of a via-level dielectric layer and bit-line-connection via structures according to an embodiment of the present disclosure.
Figure 2B:
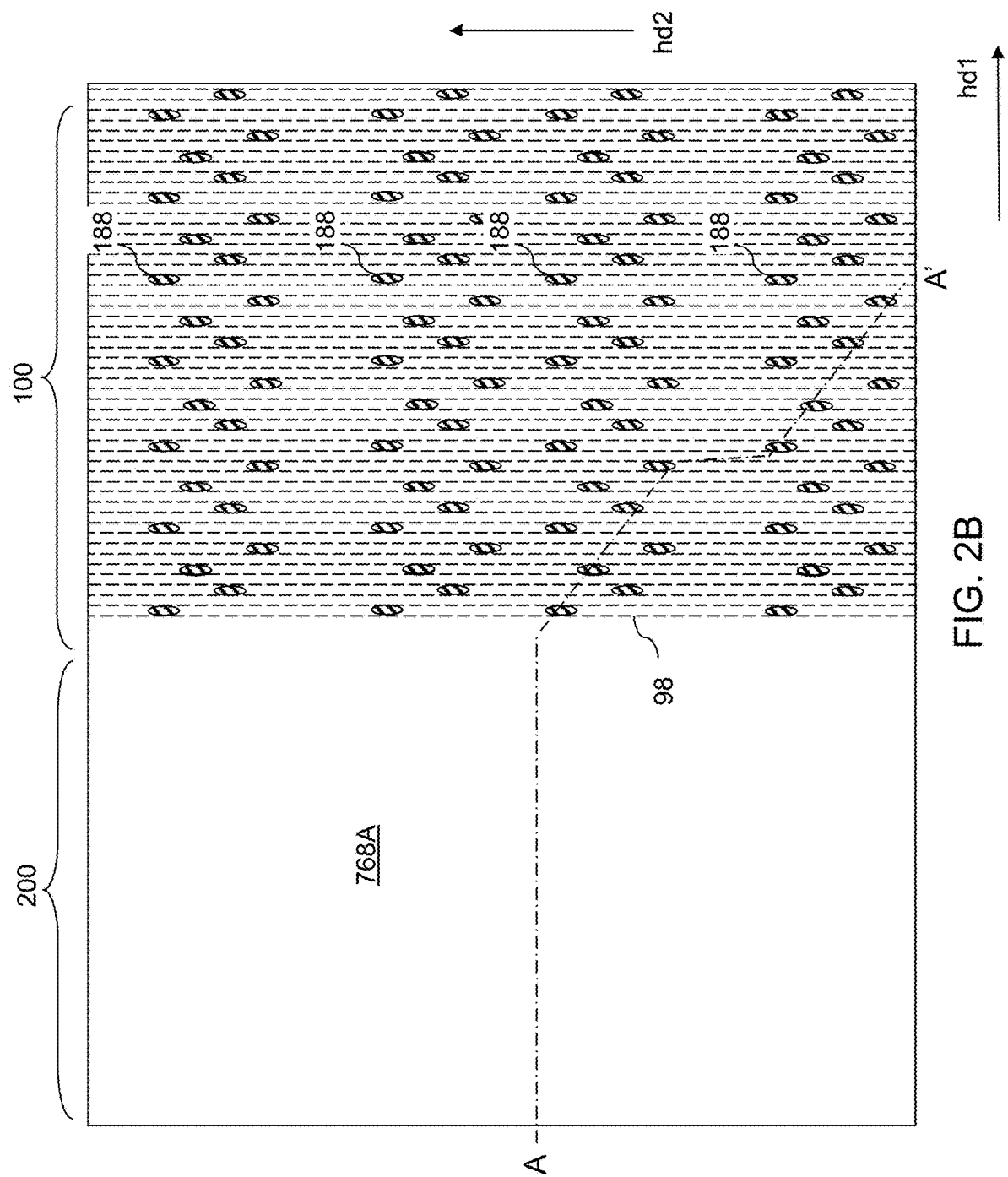
FIG. 2B is a top-down view of the exemplary structure of FIG. 2A. The hinged vertical plane A-A' is the plane of the vertical cross-sectional view of FIG. 2A.

Referring to FIGS. 2A and 2B, a via-level dielectric layer 768A may be formed over the bit lines 98 and the lower-interconnect-level dielectric material layers 764. In one embodiment, unfilled gaps may be present between neighboring pairs of bit lines 98, and a dielectric material of the via-level dielectric layer 768A may be anisotropically deposited to provide voids between neighboring pairs of bit lines 98. Bit-line-connection via structures 188 may be formed through the via-level dielectric layer 768A. Each bit-line-connection via structure 188 may be elongated along the second horizontal direction hd2. The width of each bit-line-connection via structure 188 along the first horizontal direction hd1 may be about the same as the width of each bit line 98. In one embodiment, the bit-line-connection via structures 188 may be elongated along the second horizontal direction hd2 with a length-to-width ratio in a range from 1.5 to 10, such as from 2 to 5.

The general pattern of the bit-line-connection via structures 188 may be the same as the pattern of memory stack structures to be subsequently formed in the memory array region 100. In one embodiment, the bit-line-connection via structures 188 may be arranged as multiple clusters that are laterally spaced apart along the second horizontal direction hd2. Each cluster of bit-line-connection via structures 188 may include a number N of rows that extend along the first horizontal direction hd1. The number N may be in a range from 2 to 16. Each bit line 98 may contact a respective bit-line-connection via structure 188 within each cluster of bit-line-connection via structures 188. The pattern of the bit-line-connection via structures 188 may repeat at every N-th bit line 98 along the first horizontal direction within each cluster of bit-line-connection via structures 188. The total number of the bit-line-connection via structures 188 may be the same as the total number of memory stack structures to be subsequently formed.

Figure 2C:
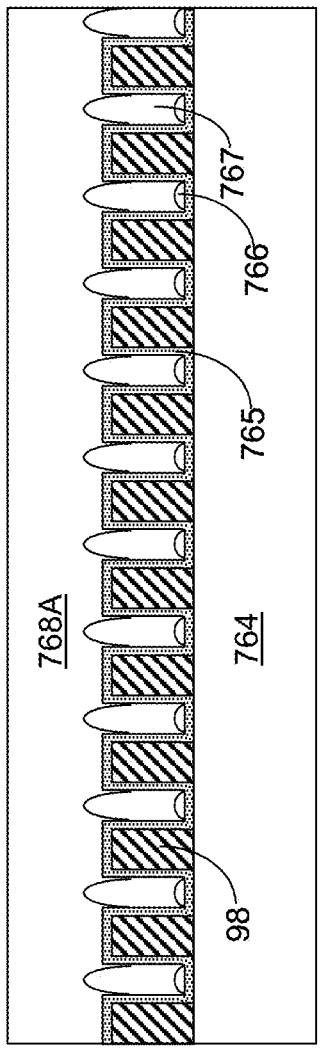
FIG. 2C is a vertical cross-sectional view of a region of the exemplary structure after formation of the via-level dielectric layer according to an embodiment of the present disclosure.
Figure 2D:
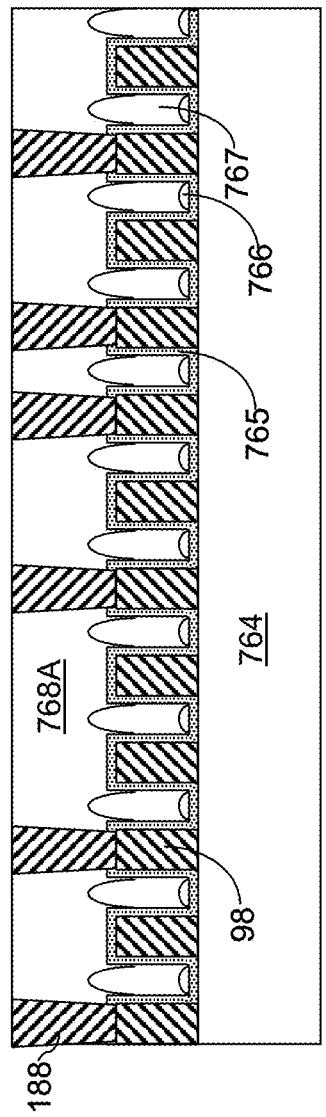
FIG. 2D is a vertical cross-sectional view of a region of the exemplary structure after formation of the bit-line-connection via structures without any overlay error according to an embodiment of the present disclosure.
Figure 2E:
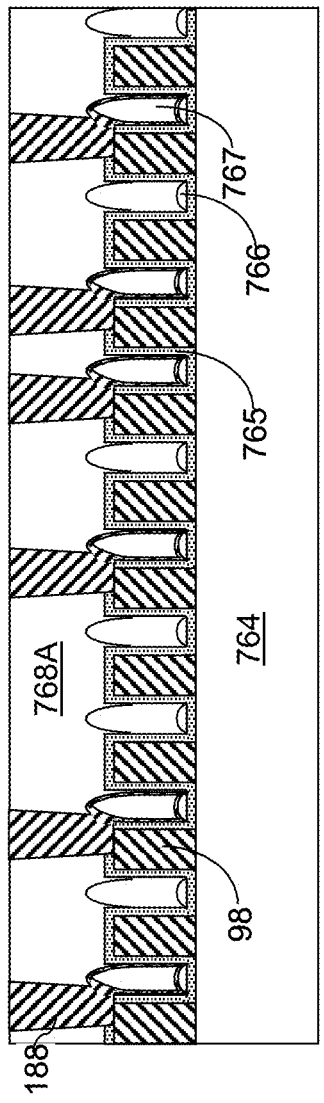
FIG. 2E is a vertical cross-sectional view of a region of the exemplary structure after formation of the bit-line-connection via structures with an overlay error according to an embodiment of the present disclosure.

FIGS. 2C-2E illustrates an exemplary processing sequence for forming the bit-line-connection via structures 188 and the via-level dielectric layer 768A of FIGS. 2A and 2B.

Referring to FIG. 2C, the bit lines 98 as provided at the processing steps of FIG. 1C may have gaps throughout. According to an embodiment of the present disclosure, a bit-line dielectric liner 765 that conformally covers sidewalls and top surfaces of the bit lines 98 may be formed by a conformal deposition process. The bit-line dielectric liner 765 includes a non-porous dielectric material such as silicon nitride, silicon oxynitride, a dielectric metal oxide material, and nitrogen-doped organosilicate glass. The bit-line dielectric liner 765 may be formed by a conformal deposition process such as atomic layer deposition (ALD) or low pressure chemical vapor deposition. The thickness of the bit-line dielectric liner 765 may be in a range from 3% to 30% of the spacing between a neighboring pair of bit lines 98. For example, the thickness of the bit-line dielectric liner 765 may be in a range from 1 nm to 5 nm, although lesser and greater thicknesses may also be used.

A via-level dielectric layer 768A may be formed over the bit-line dielectric liner 765 by an anisotropic deposition process such as plasma enhanced chemical vapor deposition. The via-level dielectric layer 768A may include a dielectric material such as undoped silicate glass, a doped silicate glass, non-porous organosilicate glass, and porous organosilicate glass. The thickness of the via-level dielectric layer 768A over the top surfaces of the bit lines 98 may be in a range from 50 nm to 300 nm, although lesser and greater thicknesses may also be used. The narrow width of each gap between neighboring pairs of vertical portions of the bit-line dielectric liner 765 and the anisotropic nature of the deposition process cause pinch off of the deposited dielectric material above each gap. Discrete dielectric strip portions 766 are formed on recessed horizontal surfaces of the bit-line dielectric liner 765 underneath each gap between neighboring pairs of vertical portions of the bit-line dielectric liner 765.

Unfilled volumes of the gaps between neighboring pairs of vertical portions of the bit-line dielectric liner 765 are herein referred to as inter-bit-line cavities 767. The via-level dielectric layer 768A is formed with curved bottom surfaces that overlie the inter-bit-line cavities 767. The inter-bit-line cavities 767 are formed between neighboring pairs of bit lines 98. The inter-bit-line cavities 767 laterally extend along the second horizontal direction hd2, which is the lengthwise direction of the bit lines 98. Each of the inter-bit-line cavities 767 is vertically bounded by a curved bottom surface portion of the via-level dielectric layer 768A and a convex surface of a respective dielectric strip portion 766. The inter-bit-line cavities 767 are freed of any solid or liquid material, and provides regions of relative permittivity of 1.0. Capacitive coupling between the bit lines 98 may be reduced due to the presence of the inter-bit-line cavities 767, and RC delay of electrical signals through the bit lines 98 may be reduced.

Referring to FIGS. 2D and 2E, a photoresist layer (not shown) may be applied over the via-level dielectric layer 768A, and may be lithographically patterned to form an array of openings therethrough. FIG. 2D illustrates a case in which the overlay error between the lithographic pattern in the photoresist layer relative to the bit lines 98 is zero. FIG. 2E illustrates a case in which the overlay error between the lithographic pattern in the photoresist layer relative to the bit lines 98 is at a maximum tolerance.

The pattern of the openings in the photoresist layer may be transferred through the via-level dielectric layer 768A to form an array of elongated via cavities. At least one conductive material may be deposited in the array of elongated via cavities. Excess portions of the at least one conducive material may be removed from above the horizontal plane including the top surface of the via-level dielectric layer 768A by a planarization process, which may use a recess etch and/or chemical mechanical planarization (CMP). Each remaining portion of the at least one conductive material in a respective elongated via cavity constitutes a bit-line-connection via structure 188. Each bit-line-connection via structure 188 may include a metallic nitride liner (such as a TiN layer) and a metallic fill material portion (such as a tungsten portion).

According to an aspect of the present disclosure, the presence of the bit-line dielectric liner 765 between bit lines 98 prevents electrical short between neighboring pairs of bit lines 98 in case the elongated via cavities extending through the via-level dielectric layer 768A connect to a respective one of the inter-bit-line cavities 767. In a configuration in which the bit-line dielectric liner 765 is not present, the at least one conductive material that is deposited into the elongated via cavities through the via-level dielectric layer 768A may continuously extend into an adjoining inter-bit-line cavity 767 and may be deposited on sidewalls of a neighboring pair of bit lines 98, thereby forming an electrically conductive path between the neighboring pair of bit lines 98. The bit-line dielectric liner 765 of the present disclosure cover the sidewalls of the bit lines 98 around each inter-bit-line cavity 767. Thus, even when an elongated via cavity extending through the via-level dielectric layer 768A is connected to a respective one of the inter-bit-line cavities 767, the deposited conductive material of the bit-line-connection via structures 188 physically contacts only one bit line 98, and is spaced from any other bit line 98 at least by a vertical portion of the bit-line dielectric liner 765. Thus, the bit-line dielectric liner 765 of the present disclosure provides short-free electrical connection to underlying bit lines 98.

Figure 3A:
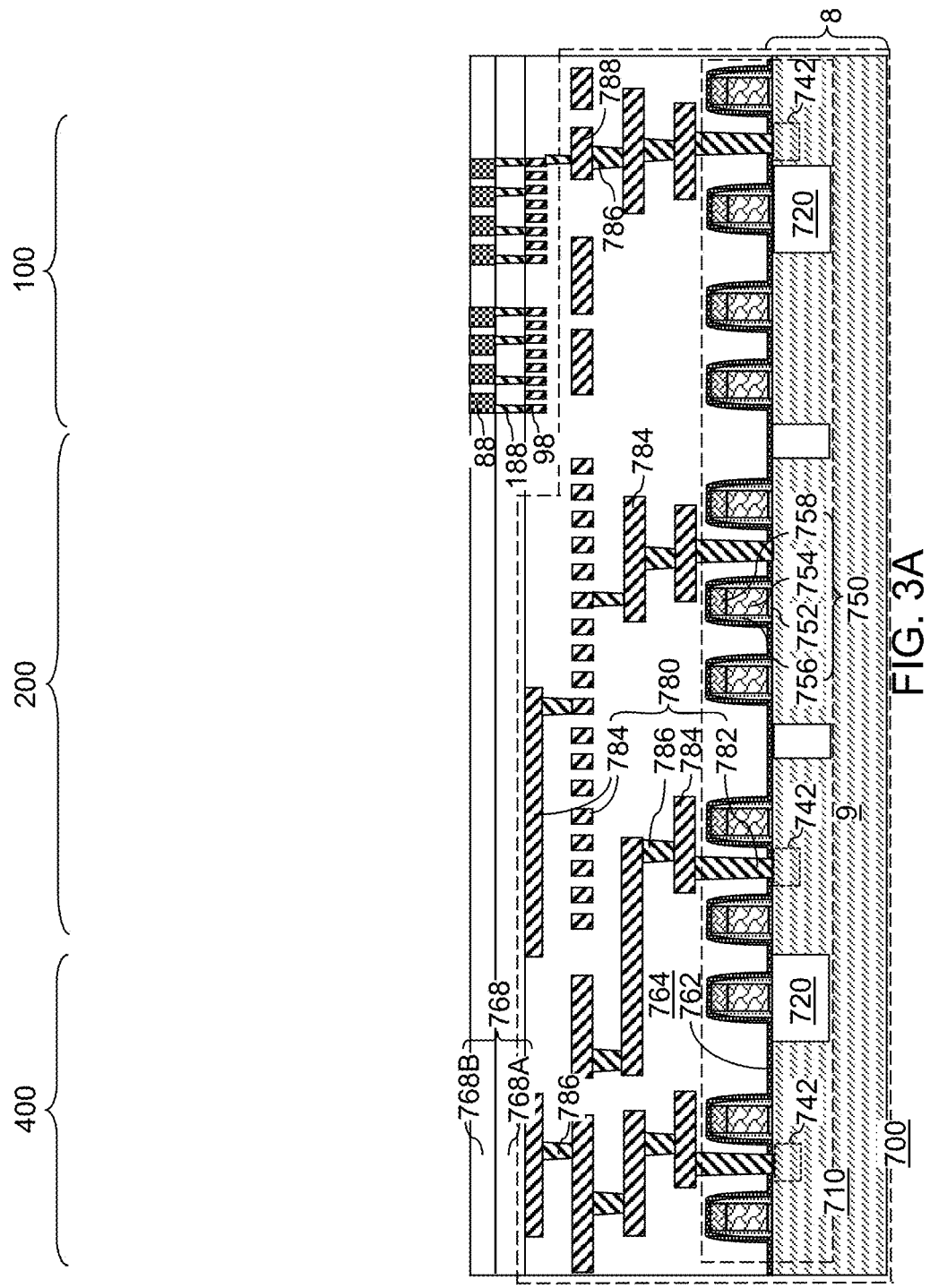
FIG. 3A is a vertical cross-sectional view of an exemplary structure after formation of a drain-level dielectric layer and pillar-shaped drain regions according to an embodiment of the present disclosure.
Figure 3B:
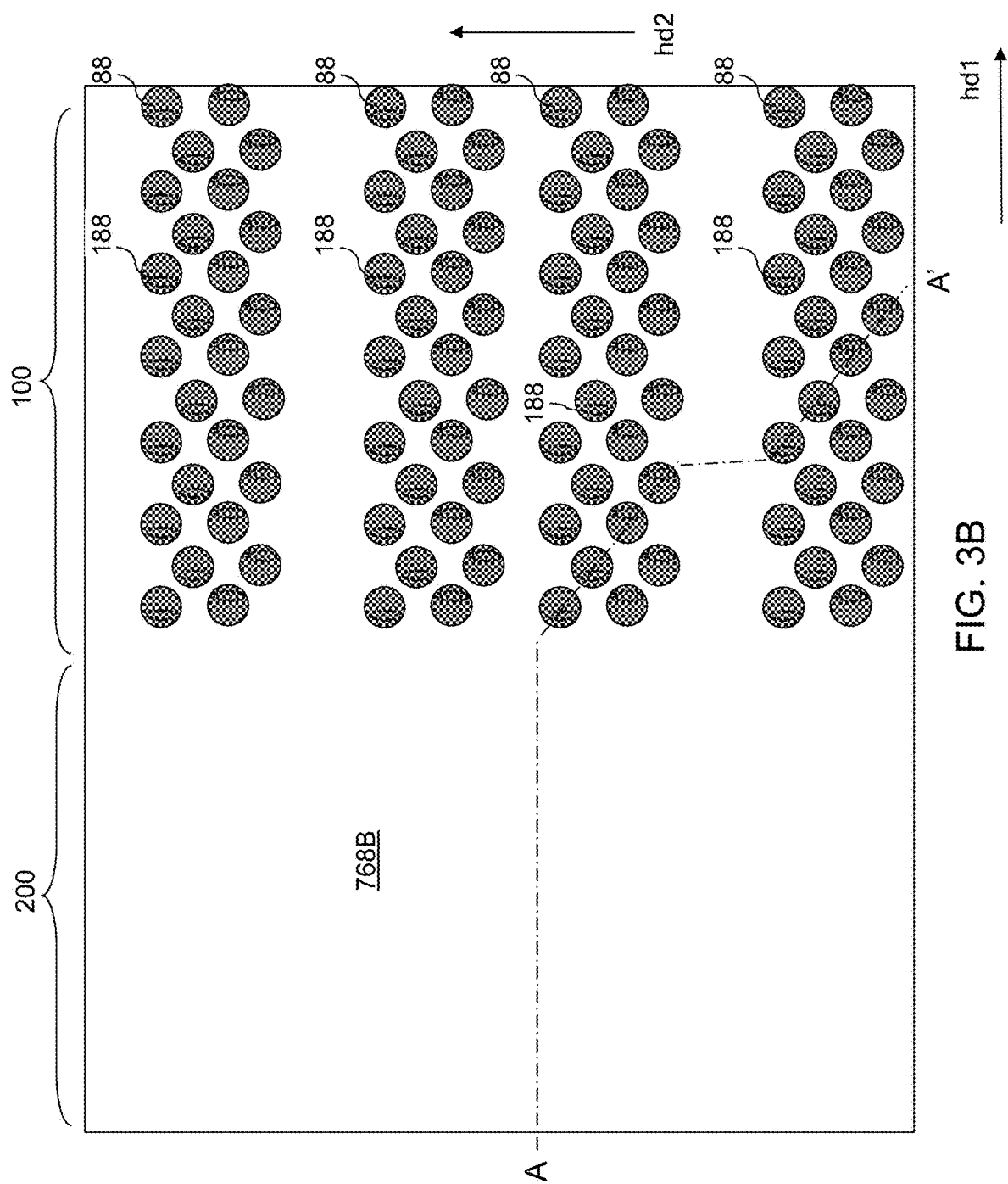
FIG. 3B is a top-down view of the exemplary structure of FIG. 3A. The hinged vertical plane A-A' is the plane of the vertical cross-sectional view of FIG. 3A.

Referring to FIGS. 3A and 3B, a drain-level dielectric layer 768B may be deposited on the via-level dielectric layer 768A. The drain-level dielectric layer 768B includes a dielectric material such as undoped silicate glass, a doped silicate glass, or a porous or non-porous organosilicate glass. The thickness of the drain-level dielectric layer 768B may be in a range from 50 nm to 300 nm, although lesser and greater thicknesses may also be used. The drain-level dielectric layer 768B and the via-level dielectric layer 768A are collectively referred to as drain-side dielectric layers 768.

Cylindrical cavities may be formed through the drain-level dielectric layer 768B. For example, a photoresist layer (not shown) may be applied over the drain-level dielectric layer 768B, and may be lithographically patterned to form openings therein. Each opening in the photoresist layer overlies one, and only one, of the bit-line-connection via structures 188. Each opening in the photoresist layer may have a circular cylindrical shape or may have a lesser length-to-width ratio than the bit-line-connection via structures 188. The pattern in the photoresist layer may be transferred through the drain-level dielectric layer 768B by an anisotropic etch process. The photoresist layer may be subsequently removed, for example, by ashing. The cylindrical cavities may be formed over a respective one of the bit-line-connection via structures 188. The entire top surface of each bit-line-connection via structure 188 may be physically exposed to the cylindrical cavities. In one embodiment, the cylindrical cavities have a circular cylindrical shape or have a lesser length-to-width ratio than the bit-line-connection via structures 188. In one embodiment, the cylindrical cavities may be circular cylindrical cavities having circular horizontal cross-sectional shapes.

A conductive material may be deposited in the cylindrical cavities. In one embodiment, the conductive material may include a doped semiconductor material such as doped silicon. In one embodiment, the doped semiconductor material may include electrical dopants at an atomic concentration in a range from $5.0\times10^{19}/cm^3$ to $2.0\times10^{21}/cm^3$. Excess portions of the conductive material may be removed from above the horizontal plane including the top surface of the drain-level dielectric layer 768B by a planarization process, which may use a recess etch and/or chemical mechanical planarization. Each remaining portion of the conductive material constitutes a pillar-shaped drain region 88. Each pillar-shaped drain region 88 is formed directly on a top surface of a respective one of the bit-line-connection via structures 188.

The pillar-shaped drain regions 88 are formed through the drain-level dielectric layer 768B. The pillar-shaped drain regions 88 may be formed in multiple clusters. Each cluster of pillar-shaped drain regions 88 may be formed over a respective cluster of bit-line-connection via structures 188. Each cluster of pillar-shaped drain regions 88 may be formed as a periodic two-dimensional array of pillar-shaped drain regions 88. The geometrical centers of the bit-line-connection via structures 188 may be offset from geometrical centers of the pillar-shaped drain regions 88 so that periodic two-dimensional array of bit-line-connection via structures 188 overlie a set of bit-line-connection via structures 188 that do not form a periodic two-dimensional array. In one embodiment, each of the pillar-shaped drain regions 88 contacts an entire top surface of an underlying one of the bit-line-connection via structures 188, and has a greater horizontal cross-sectional area than a horizontal cross-sectional area of the underlying one of the bit-line-connection via structures 188. In one embodiment, the pillar-shaped drain regions 88 have a circular cylindrical shape or have a lesser length-to-width ratio than the bit-line-connection via structures 188.

Figure 4:
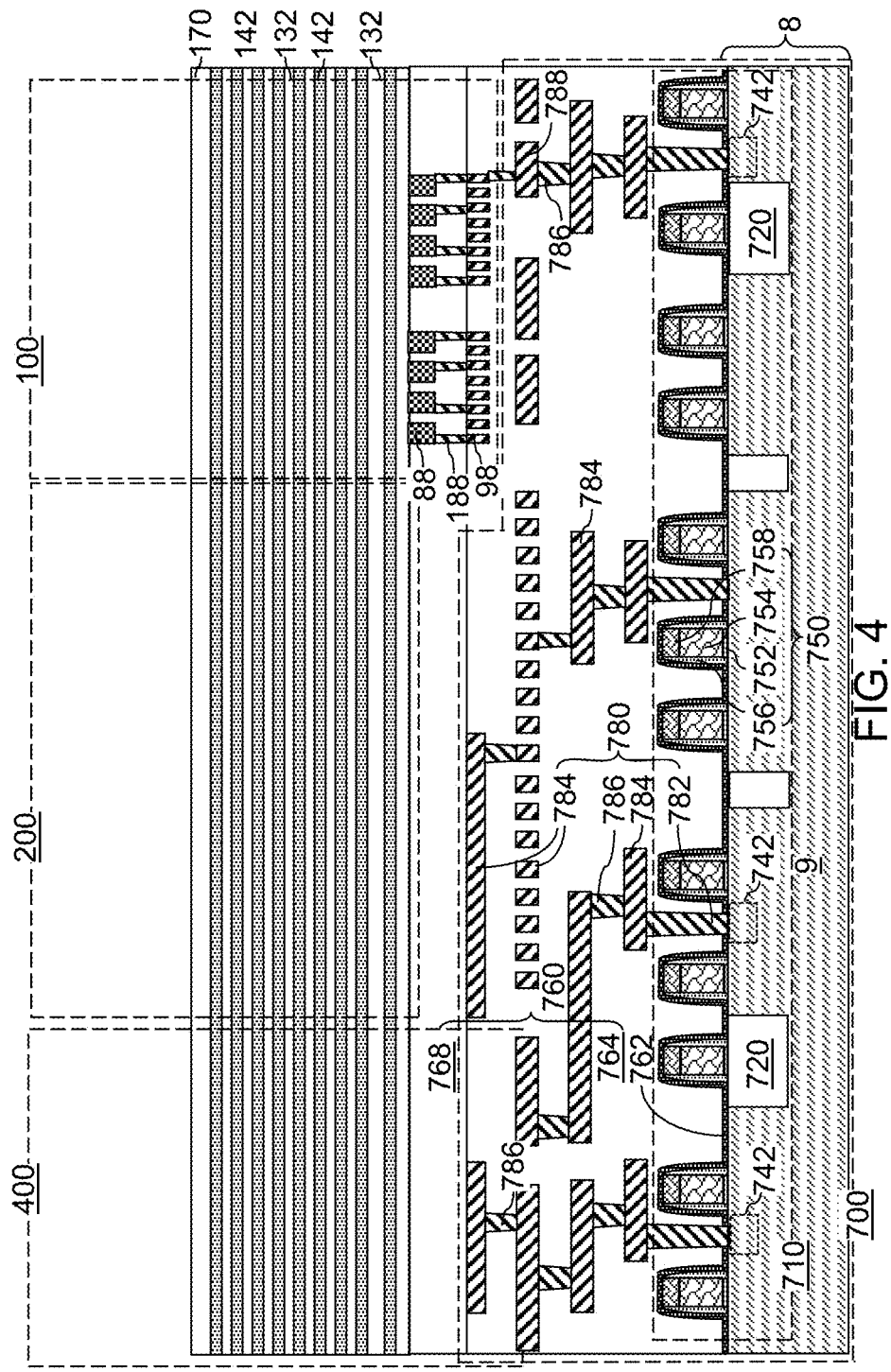
FIG. 4 is a vertical cross-sectional view of the exemplary structure after formation of a first-tier alternating stack of first insulting layers and first spacer material layers according to an embodiment of the present disclosure.

Referring to FIG. 4, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the drain-side dielectric layers 768. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 5:
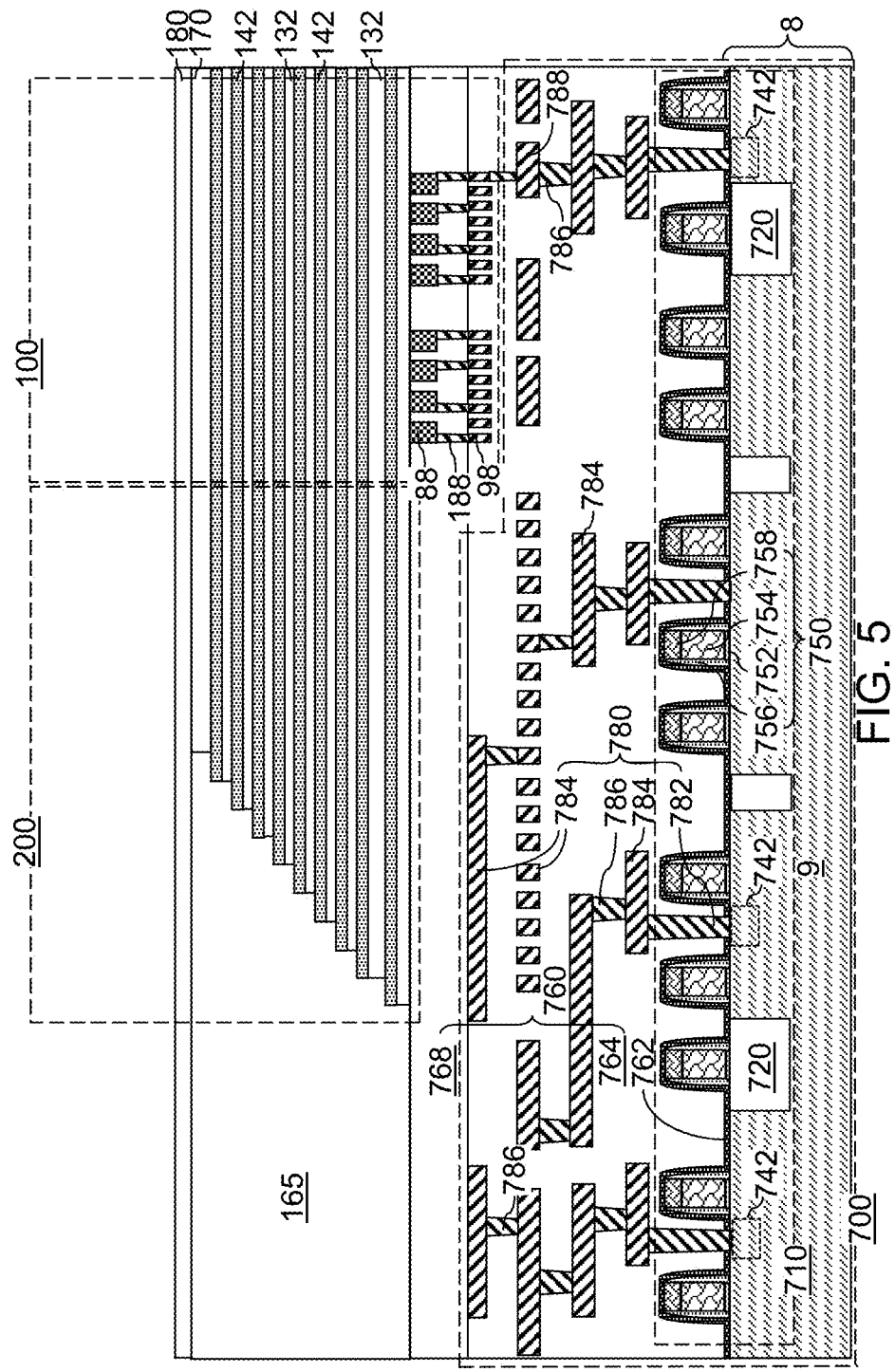
FIG. 5 is a vertical cross-sectional view of the exemplary structure after patterning a first-tier staircase region, a first retro-stepped dielectric material portion, and an inter-tier dielectric layer according to an embodiment of the present disclosure.

Referring to FIG. 5, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 6B:
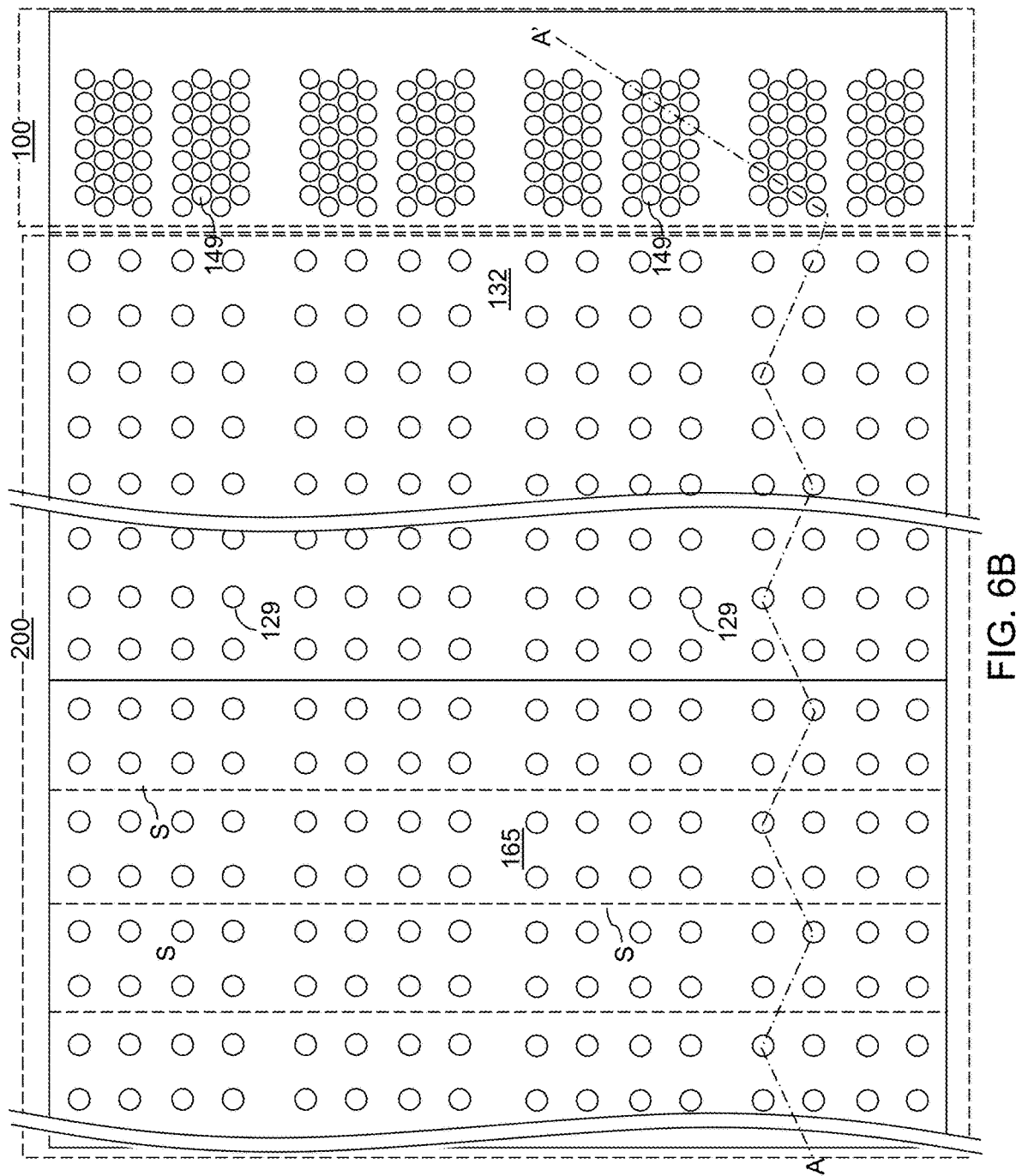
FIG. 6B is a horizontal cross-sectional of the exemplary structure along the horizontal plane B-B' of FIG. 6A. The hinged vertical plane A-A' corresponds to the plane of the vertical cross-sectional view of FIG. 6A.

Referring to FIGS. 6A and 6B, various first-tier openings (149, 129) may be formed through the inter-tier dielectric layer 180 and the first-tier structure (132, 142, 170, 165) and into the drain-side dielectric layers 768. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the drain-side dielectric layers 768 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200 and are subsequently used to provide mechanical support during subsequent processing steps. A subset of the first-tier support openings 129 may be formed through the first retro-stepped dielectric material portion 165 and through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 7:
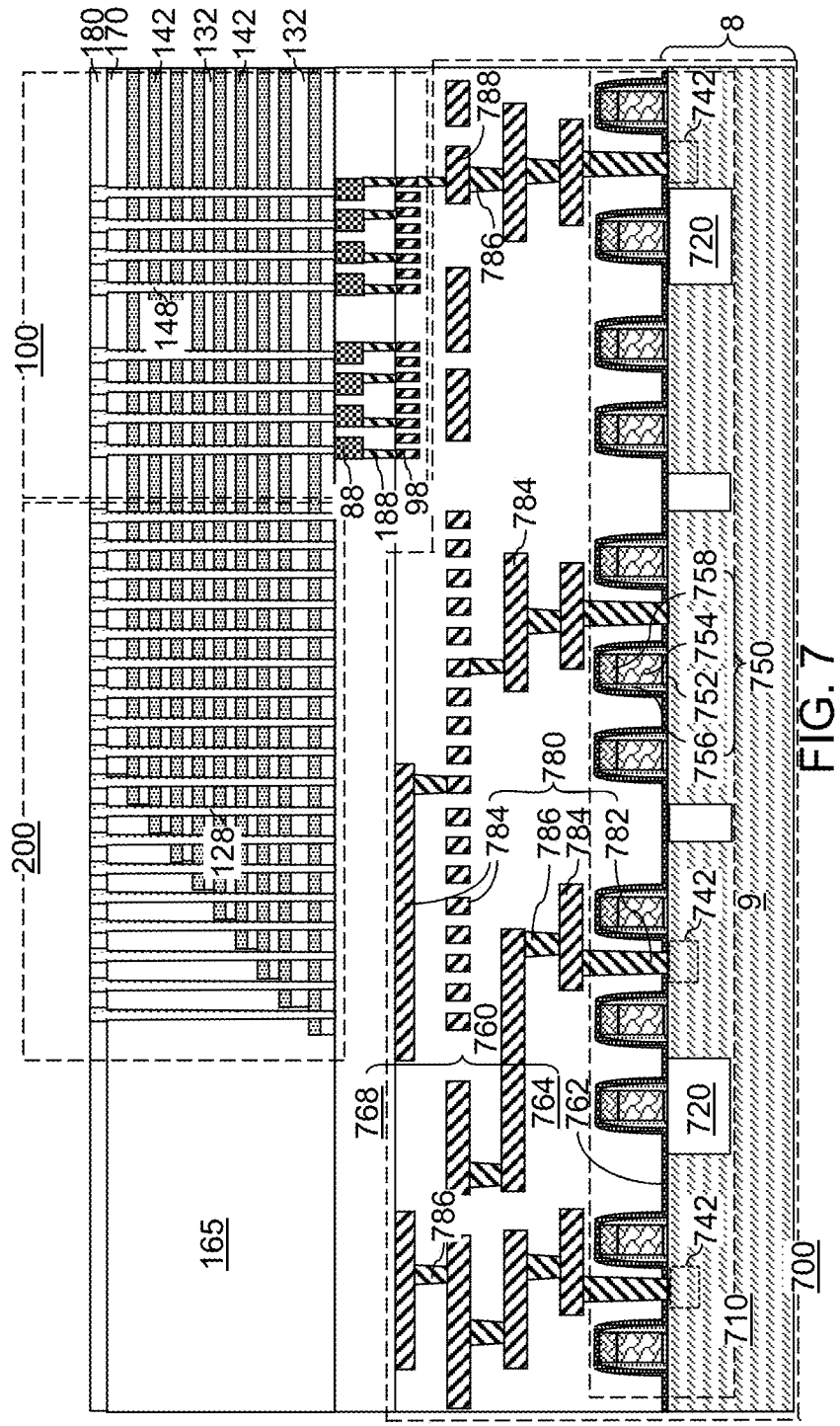
FIG. 7 is a vertical cross-sectional view of the exemplary structure after formation of various sacrificial fill structures according to an embodiment of the present disclosure.

Referring to FIG. 7, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). For example, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 8:
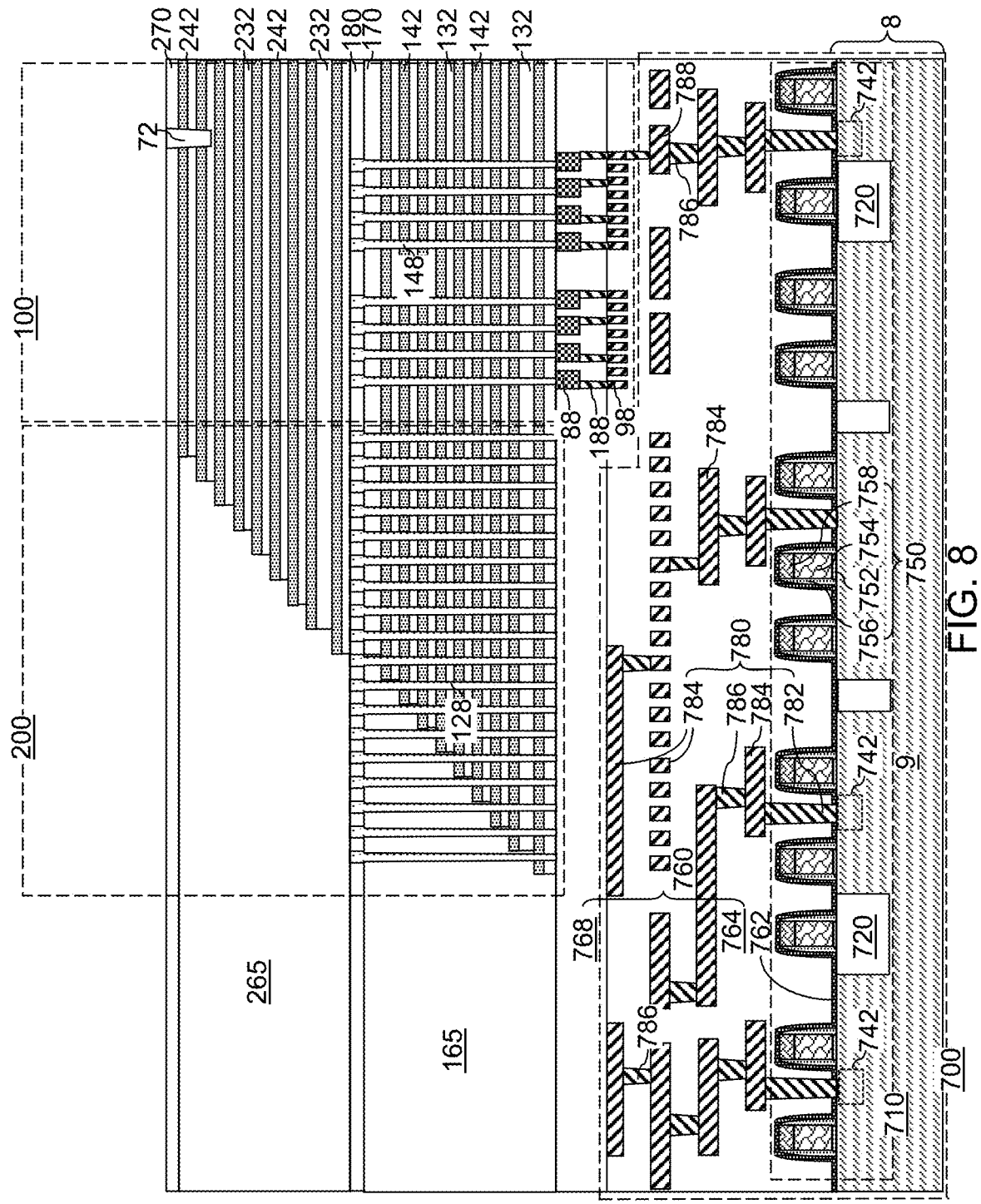
FIG. 8 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 8, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the drain-side dielectric layers 768, and at least one retro-stepped dielectric material portion (165, 265) may be formed over the staircase regions on the at least one alternating stack (132, 142, 232, 242).

Optionally, source-select-level isolation structures 72 may be formed through a subset of layers in an upper portion of the second-tier alternating stack (232, 242). The second sacrificial material layers 242 that are cut by the source-select-level isolation structures 72 correspond to the levels in which drain-select-level electrically conductive layers are subsequently formed. The source-select-level isolation structures 72 include a dielectric material such as silicon oxide. The source-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional source-select-level isolation structures 72 collectively constitute a second-tier structure (232, 242, 265, 270, 72).

Figure 9A:
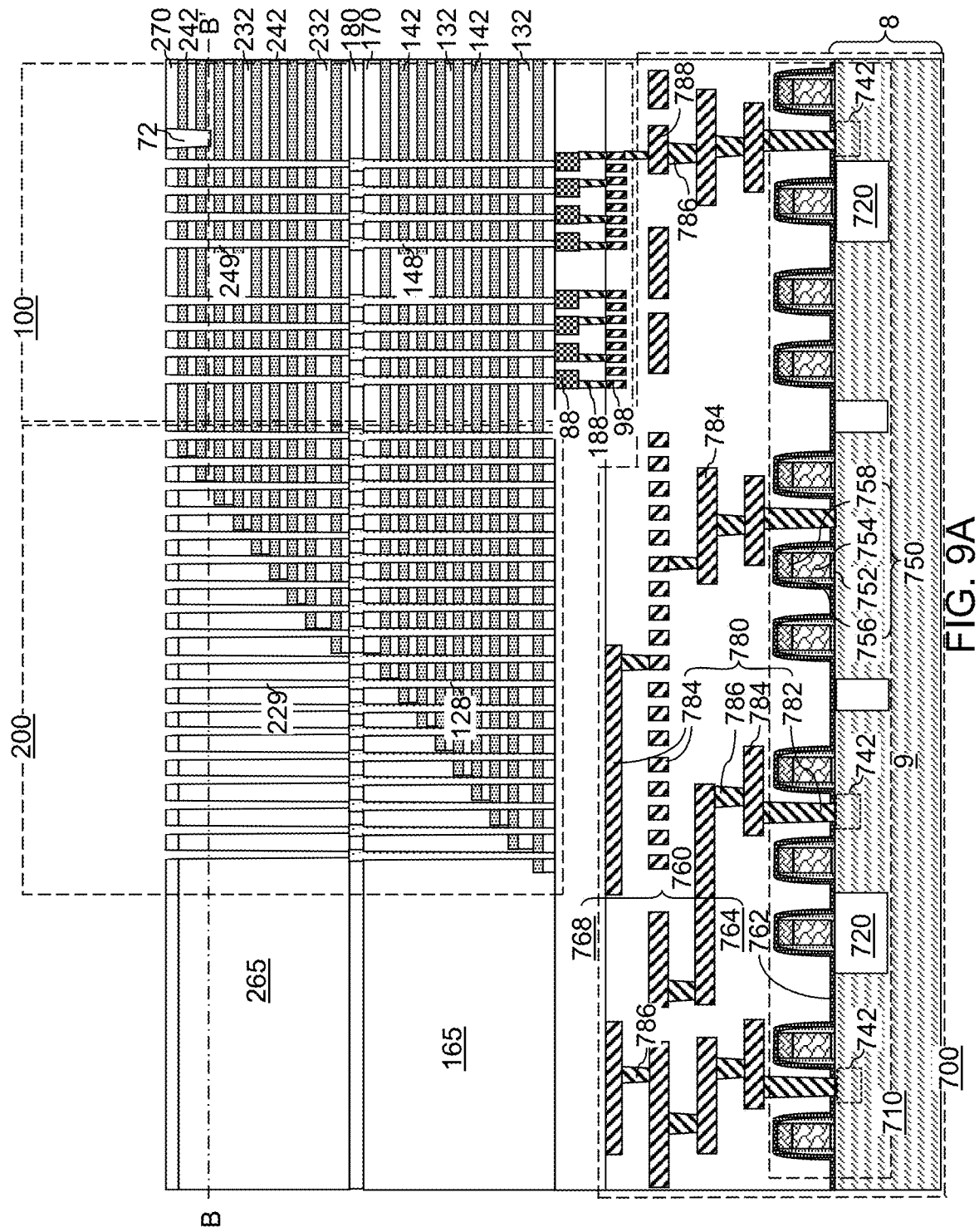
FIG. 9A is a vertical cross-sectional view of the exemplary structure after formation of second-tier memory openings and second-tier support openings according to an embodiment of the present disclosure.
Figure 9B:
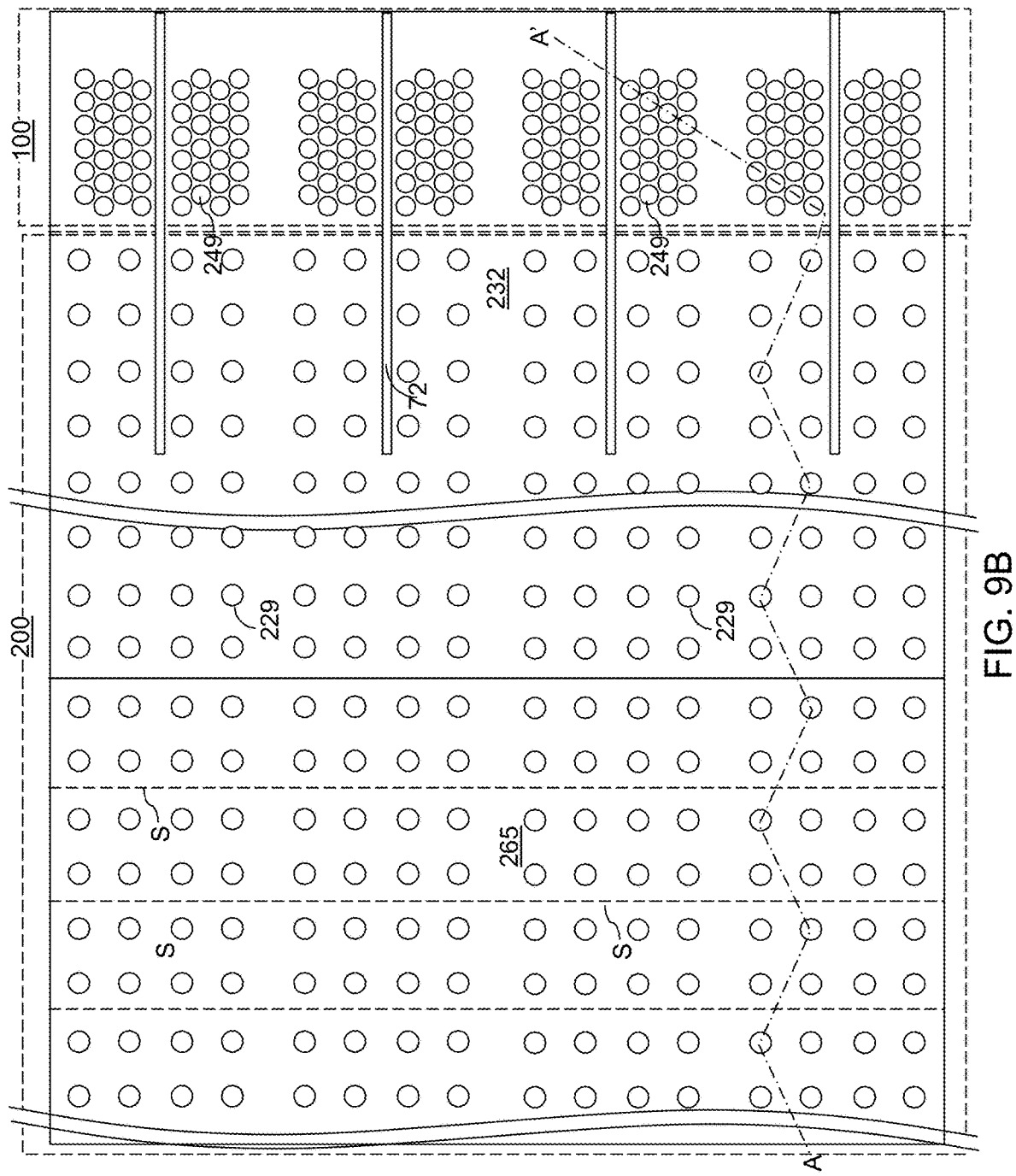
FIG. 9B is a horizontal cross-sectional of the exemplary structure along the horizontal plane B-B' of FIG. 9A. The hinged vertical plane A-A' corresponds to the plane of the vertical cross-sectional view of FIG. 9A.

Referring to FIGS. 9A and 9B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 10:
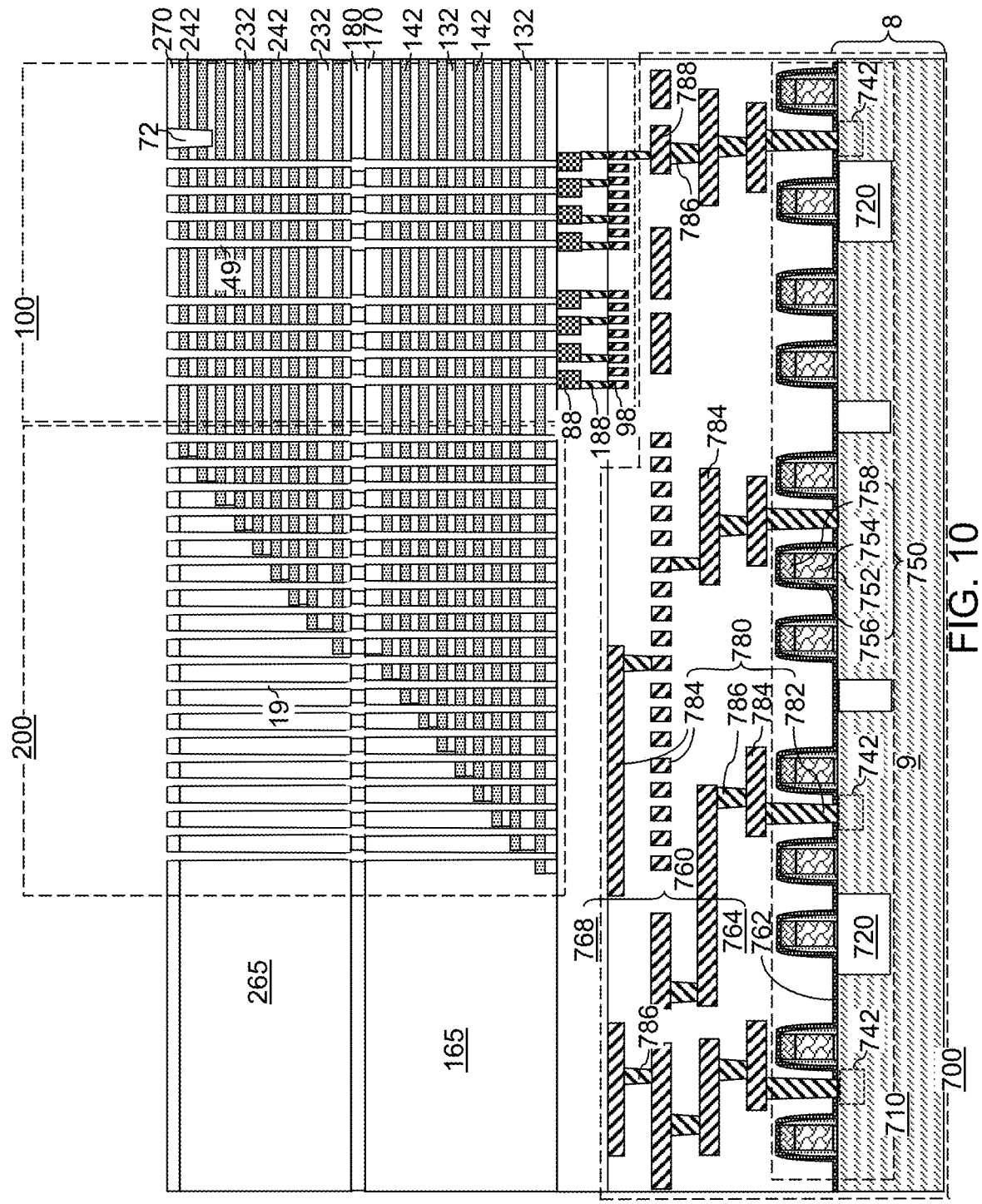
FIG. 10 is a vertical cross-sectional view of the exemplary structure after formation of inter-tier memory openings and inter-tier support openings according to an embodiment of the present disclosure.

Referring to FIG. 10, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening, is formed in each combination of a second-tier memory openings 249 and a volume from which a sacrificial first-tier memory opening fill portion 148 is removed. A support opening 19, which is also referred to as an inter-tier support opening, is formed in each combination of a second-tier support openings 229 and a volume from which a sacrificial first-tier support opening fill portion 128 is removed.

FIGS. 11A-11F provide sequential cross-sectional views of a memory opening 49 during formation of a memory opening fill structure. The same structural change occurs in each of the memory openings 49 and the support openings 19.

Referring to FIG. 11A, a memory opening 49 in the exemplary device structure of FIG. 10 is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer.

In another embodiment, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be intrinsic, or may have a doping of a first conductivity type. The atomic concentration of dopants of the first conductivity type in the first semiconductor channel layer 601 may be in a range from $1.0 \times 10^{14}/cm^3$ to $1.0 \times 10^{18}/cm^3$. The first conductivity type may be the opposite of the conductivity type of electrical dopants in the pillar-shaped drain regions 88. The conductivity type of dopants in the pillar-shaped drain regions 88 is herein referred to as a second conductivity type. For example, if the first conductivity type is p-type, the second conductivity type is n-type, and vice versa. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Figure 11C:
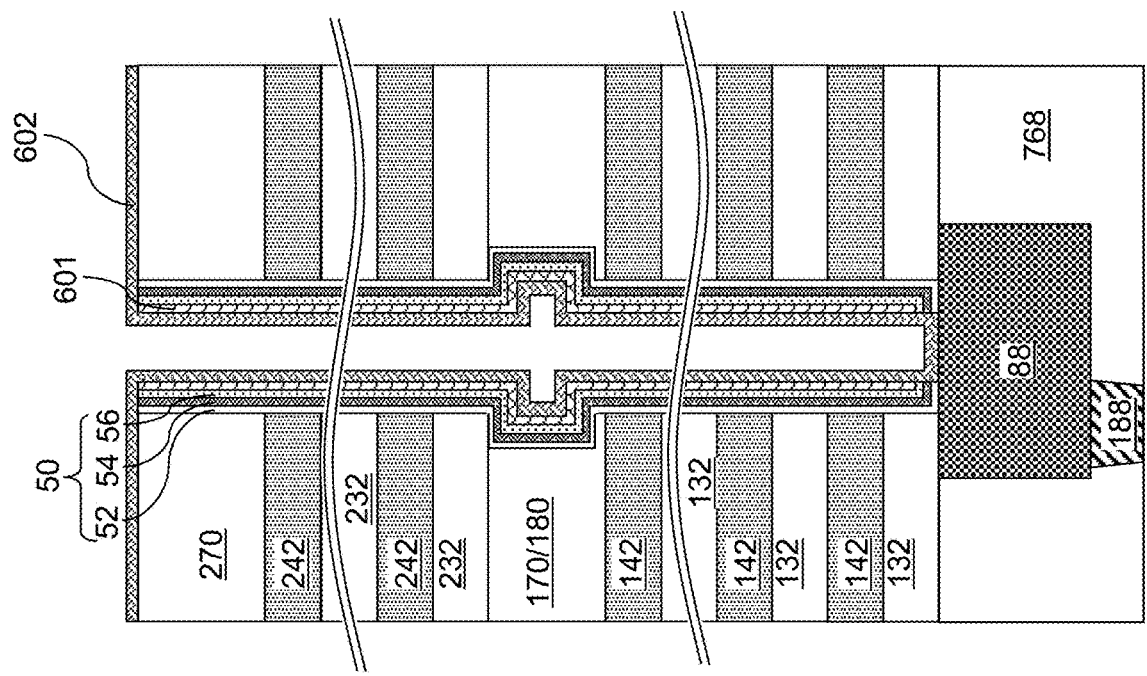

Referring to FIG. 11C, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the second insulating cap layer 270 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers (142, 242) constitutes a charge storage region.

A top surface of a pillar-shaped drain region 88 may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Figure 11D:
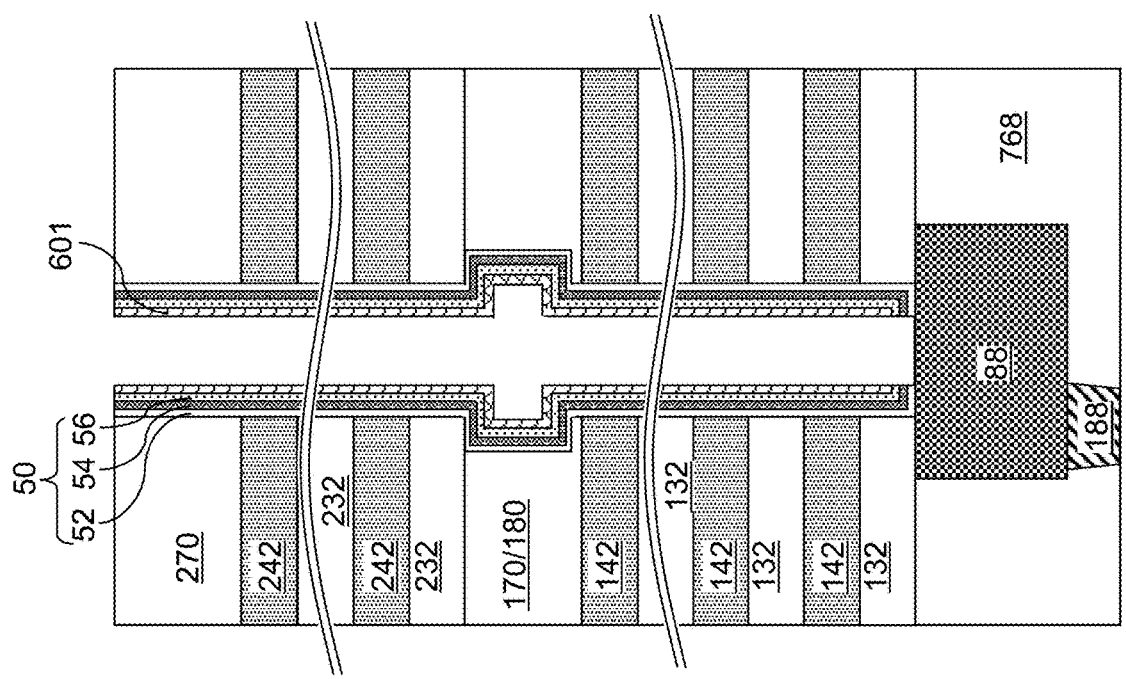

Referring to FIG. 11D, a second semiconductor channel layer 602 may be deposited directly on a top surface of an underlying pillar-shaped drain region 88 and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be intrinsic, or may have a doping of the first conductivity type. The atomic concentration of dopants of the first conductivity type in the second semiconductor channel layer 602 may be in a range from $1.0 \times 10^{14}/cm^3$ to $1.0 \times 10^{18}/cm^3$. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 11E, in case the memory cavity 49' in each memory opening is not completely filled by the second semiconductor channel layer 602, a dielectric core 62 may be deposited in the memory cavity 49' to fill any remaining portion of the memory cavity 49' within each memory opening. The dielectric core 62 includes a dielectric material such as silicon oxide or organosilicate glass. The dielectric core 62 may be deposited by a conformal deposition method such as low pressure chemical vapor deposition (LPCVD), or by a self-planarizing deposition process such as spin coating.

The horizontal portion of the dielectric core 62 may be removed, for example, by a recess etch from above the top surface of the second insulating cap layer 270. The dielectric core 62 may be further recessed within each memory opening 49, for example, by a recess etch to a depth that is located between the top surface of the second insulating cap layer 270 and the bottom surface of the second insulating cap layer 270. Further, the horizontal portion of the second semiconductor channel layer 602 located above the top surface of the second insulating cap layer 270 may be removed by a planarization process, which may use a recess etch or chemical mechanical planarization (CMP). Each remaining portion of the second semiconductor channel layer 602 may be located entirely within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. The average atomic concentration of dopants of the first conductivity type in the vertical semiconductor channel 60 may be in a range from $1.0 \times 10^{14}/cm^3$ to $1.0 \times 10^{18}/cm^3$. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 11F, source regions 61 may be formed by depositing a doped semiconductor material within each recessed region above the dielectric cores 62. The source regions 61 may have a doping of the second conductivity type, which is the opposite of the first conductivity type. The dopant concentration in the source regions 61 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the second insulating cap layer 270, for example, by chemical mechanical planarization (CMP) or a recess etch to form the source regions 61.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a source region 61 within a memory opening 49 is herein referred to as a memory opening fill structure 58. Each combination of a memory film 50, a vertical semiconductor channel 60, a dielectric core 62, and a source region 61 within each support opening 19 fills the respective support openings 19, and constitutes a support pillar structure.

Figure 12:
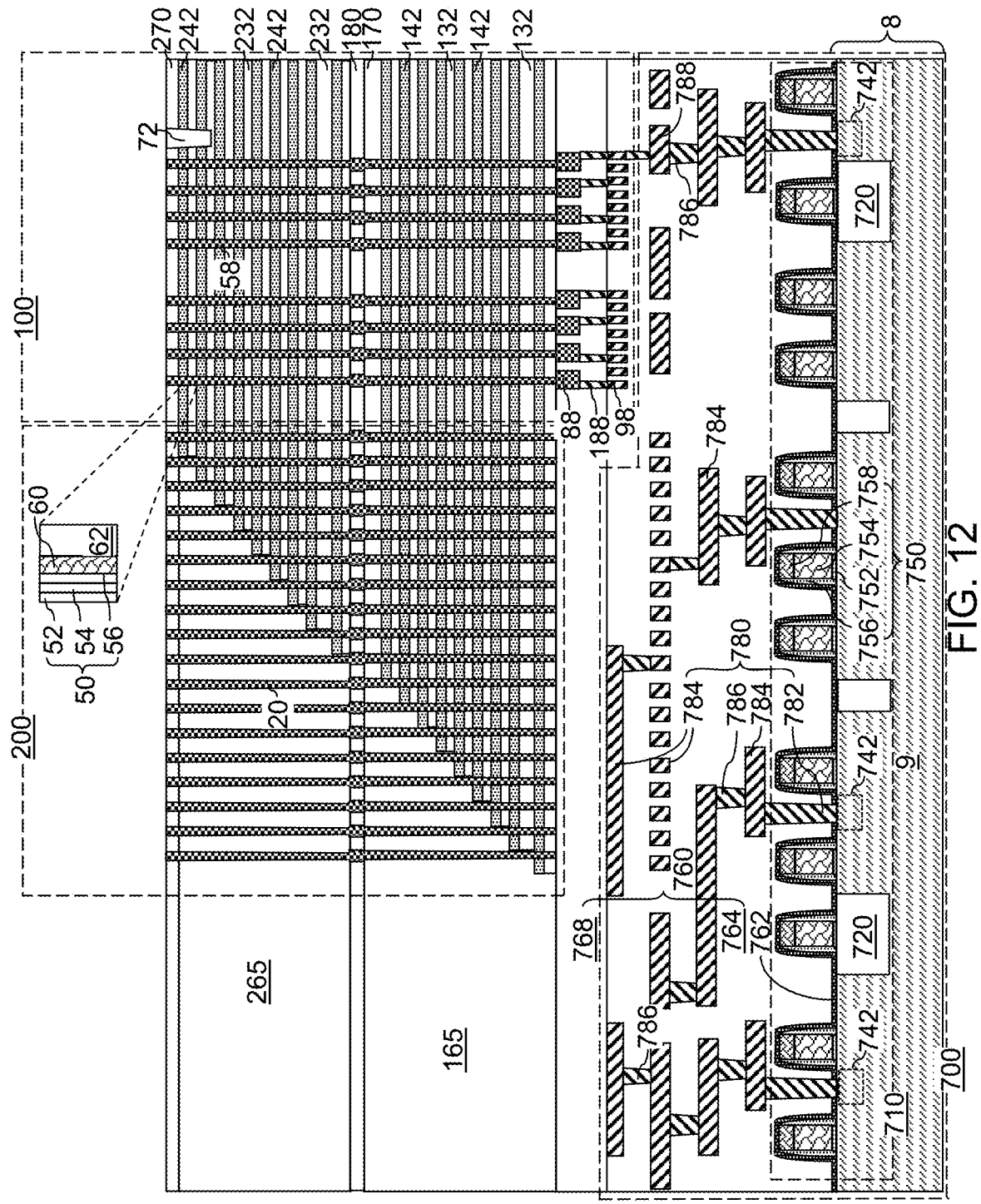
FIG. 12 is a vertical cross-sectional view of the exemplary structure after formation of memory opening fill structures and support pillar structures according to an embodiment of the present disclosure.

Referring to FIG. 12, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 10A and 10B. An instance of the support pillar structure 20 may be formed within each support opening 19 of the structure of FIGS. 10A and 10B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 13A:
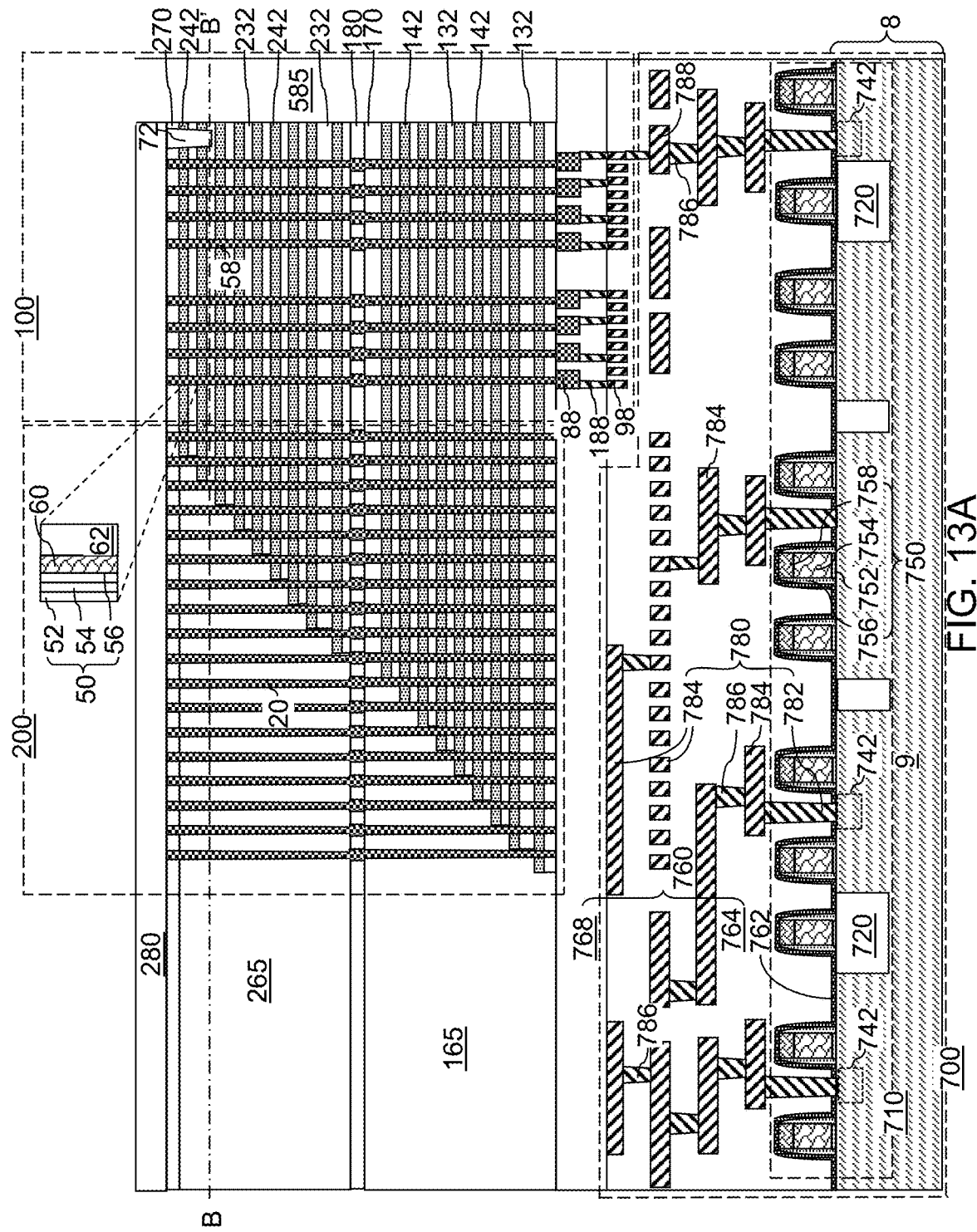
FIG. 13A is a vertical cross-sectional view of the exemplary structure after formation of pillar cavities through the alternating stacks according to an embodiment of the present disclosure.
Figure 13B:
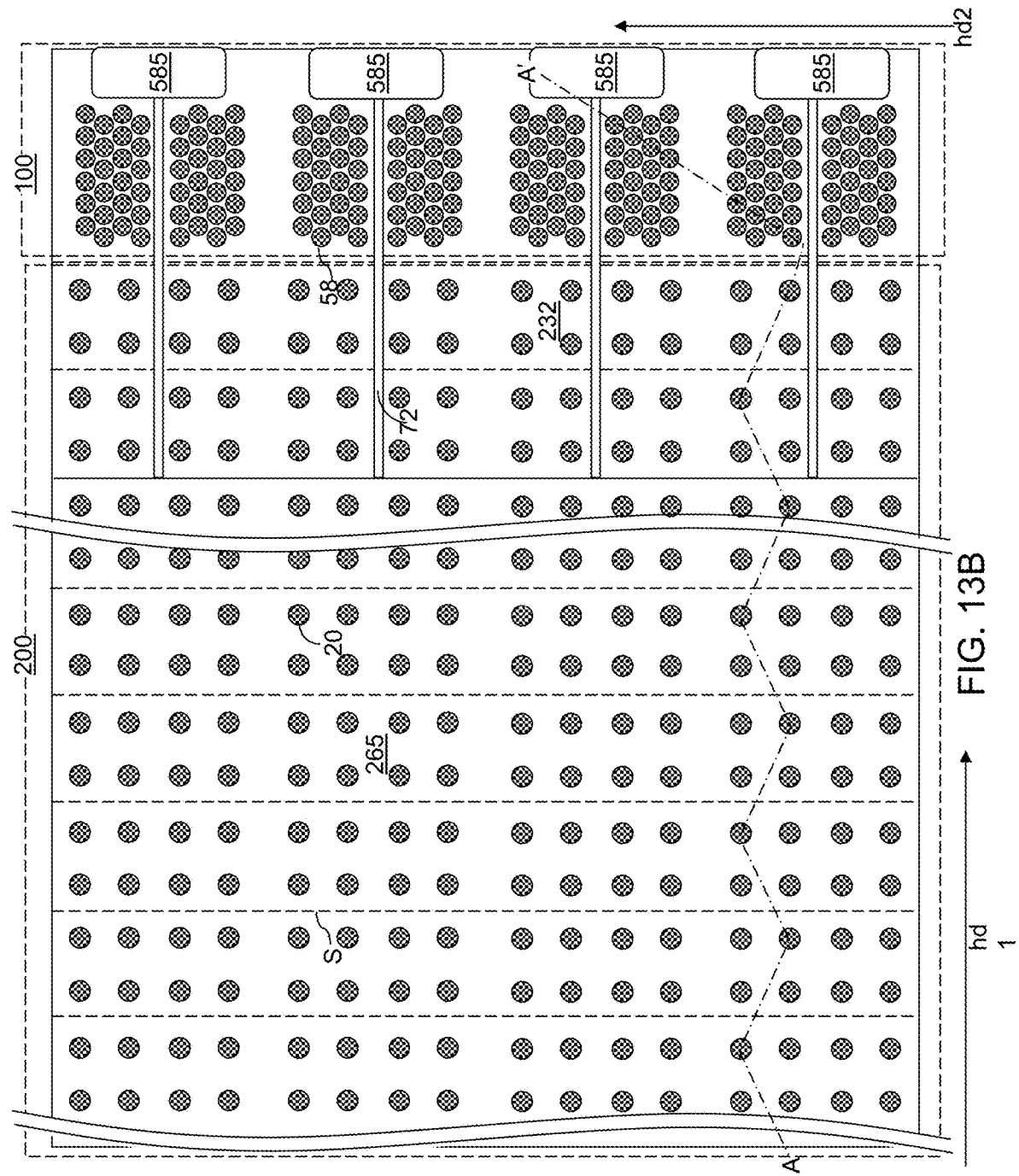
FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 13A and 13B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 14:
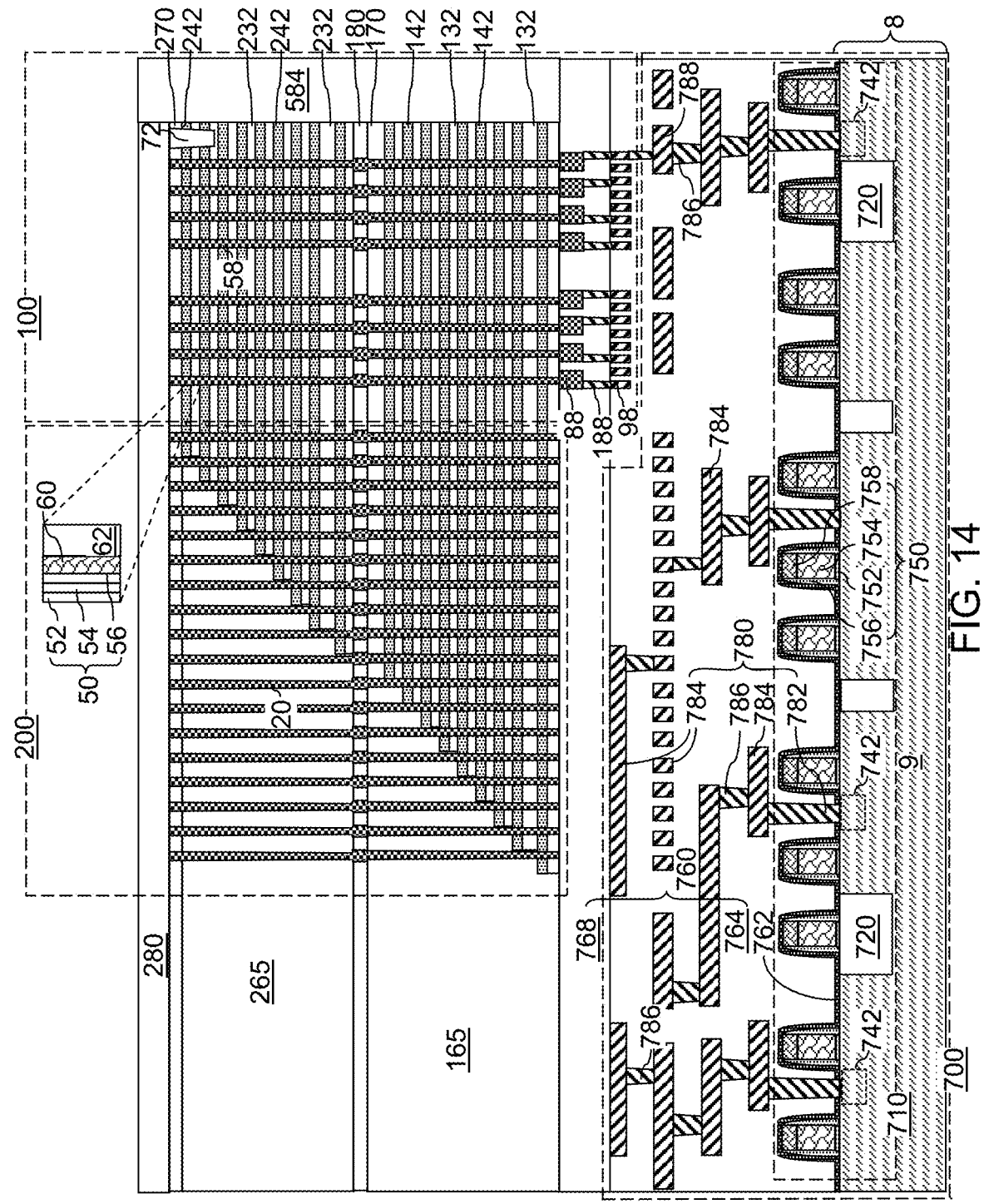
FIG. 14 is a vertical cross-sectional view of the exemplary structure after formation of dielectric pillar structures through the alternating stacks according to an embodiment of the present disclosure.

Referring to FIG. 14, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 15A:
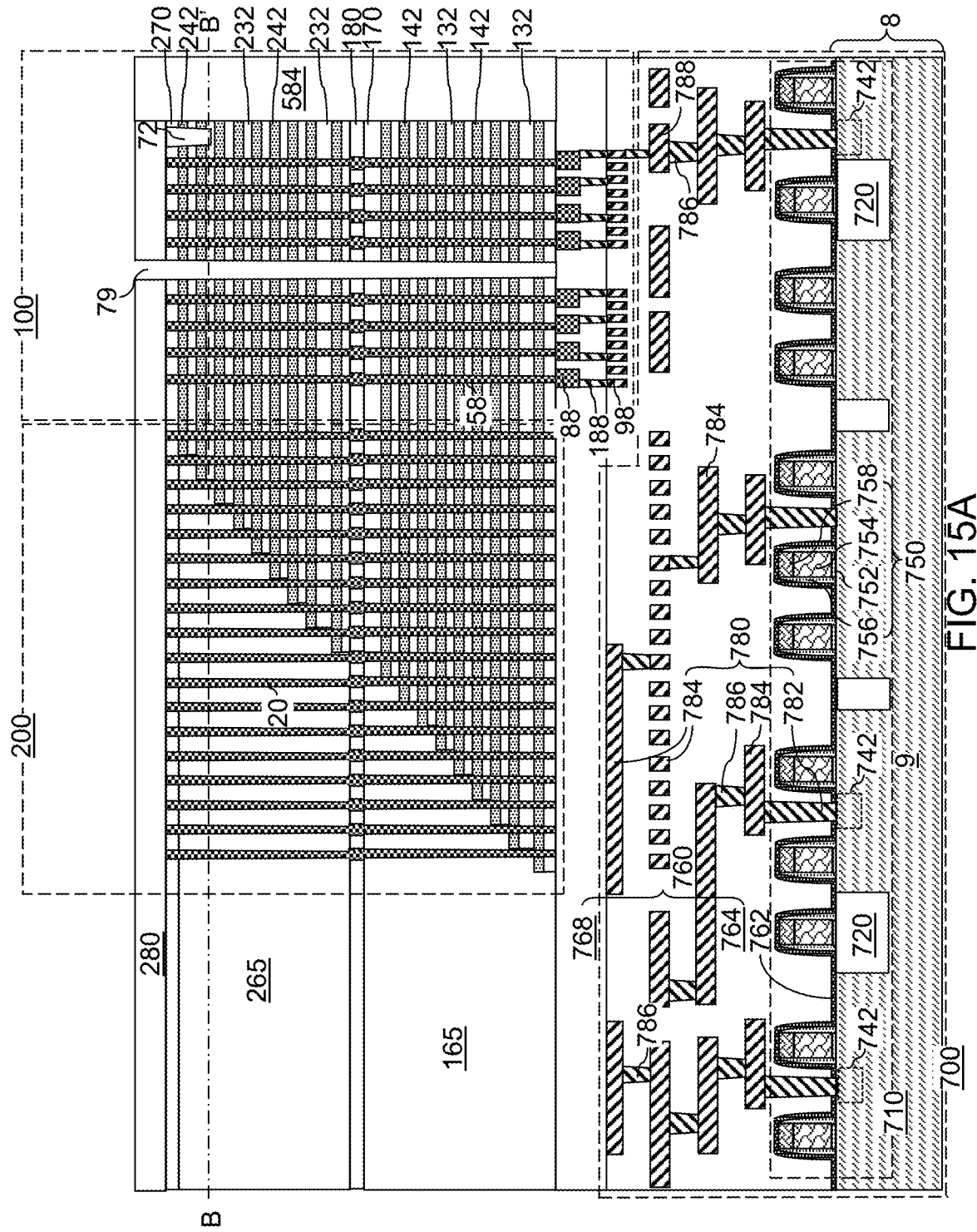
FIG. 15A is a vertical cross-sectional view of the exemplary structure after formation of backside trenches through the alternating stacks according to an embodiment of the present disclosure.
Figure 15B:
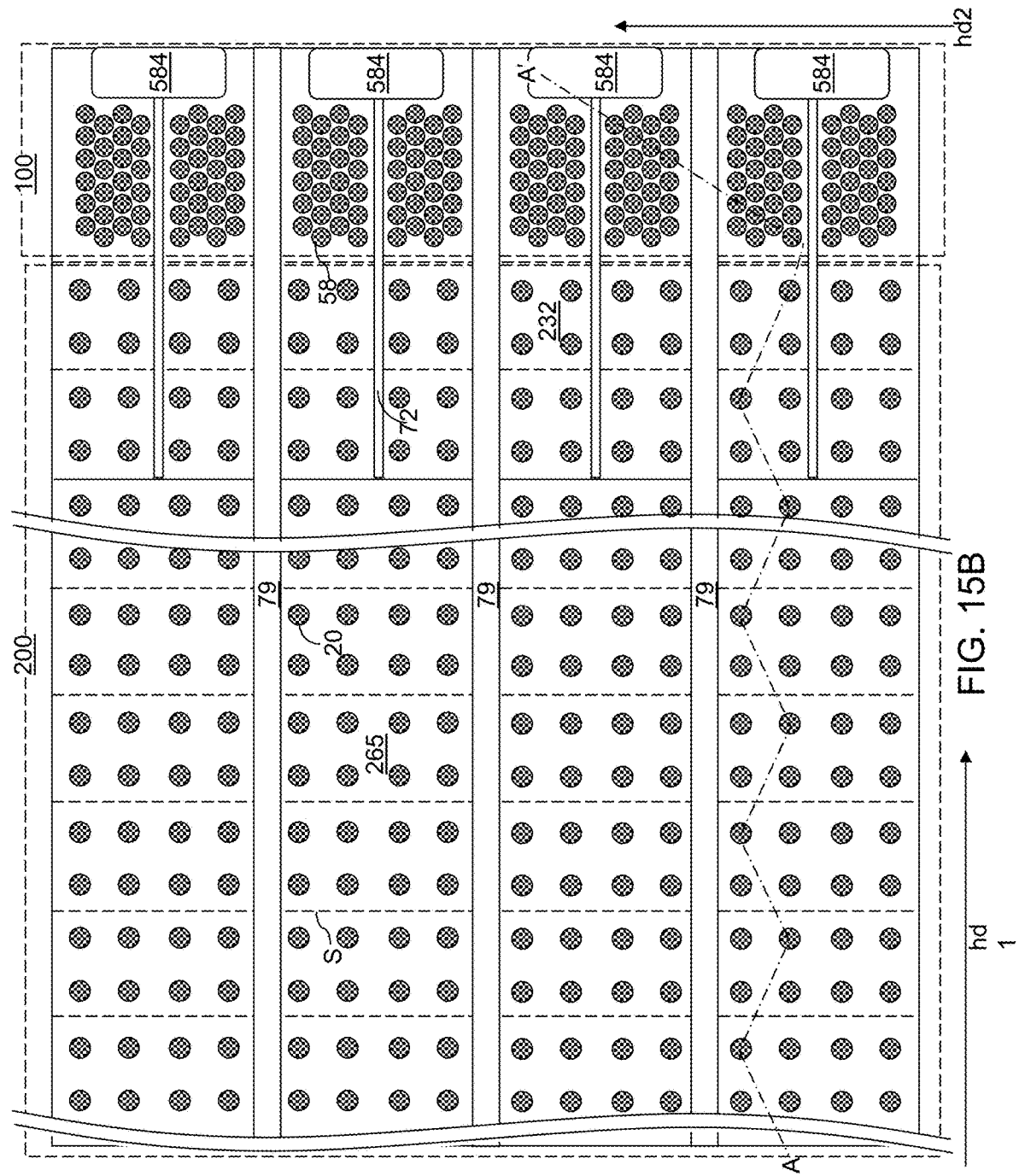
FIG. 15B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 15A and 15B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact level dielectric layer 280, the second-tier structure (232, 242, 270, 265, 72), and the first-tier structure (132, 142, 170, 165), and into the drain-side dielectric layers 768. Portions of the first contact level dielectric layer 280, the second-tier structure (232, 242, 270, 265, 72), and the first-tier structure (132, 142, 170, 165) that underlie the openings in the photoresist layer may be removed to form the backside trenches 79. In one embodiment, the backside trenches 79 may be formed between clusters of memory stack structures 55. The clusters of the memory opening fill structures 58 may be laterally spaced apart along the second horizontal direction hd2 by the backside trenches 79. A top surface of the drain-side dielectric layers 768 may be physically exposed at the bottom of each backside trench 79.

Figure 16:
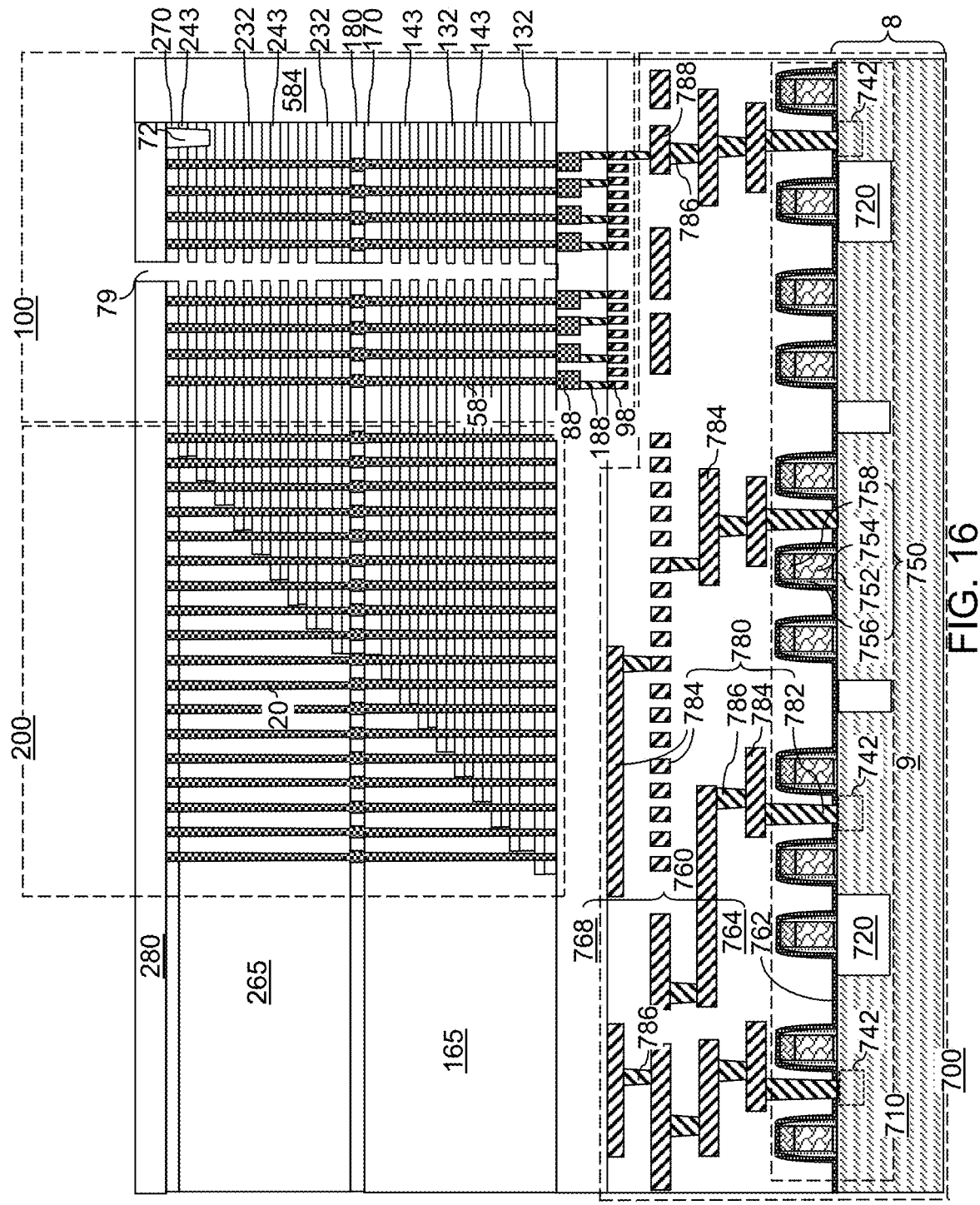
FIG. 16 is a vertical cross-sectional view of the exemplary structure after formation of backside recesses according to an embodiment of the present disclosure.

Referring to FIG. 16, the sacrificial material layers (142, 242) are may be removed selective to the insulating layers (132, 232), the first and second insulating cap layers (170, 270), the first contact level dielectric layer 280, and the drain-side dielectric layers 768. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trenches 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 17:
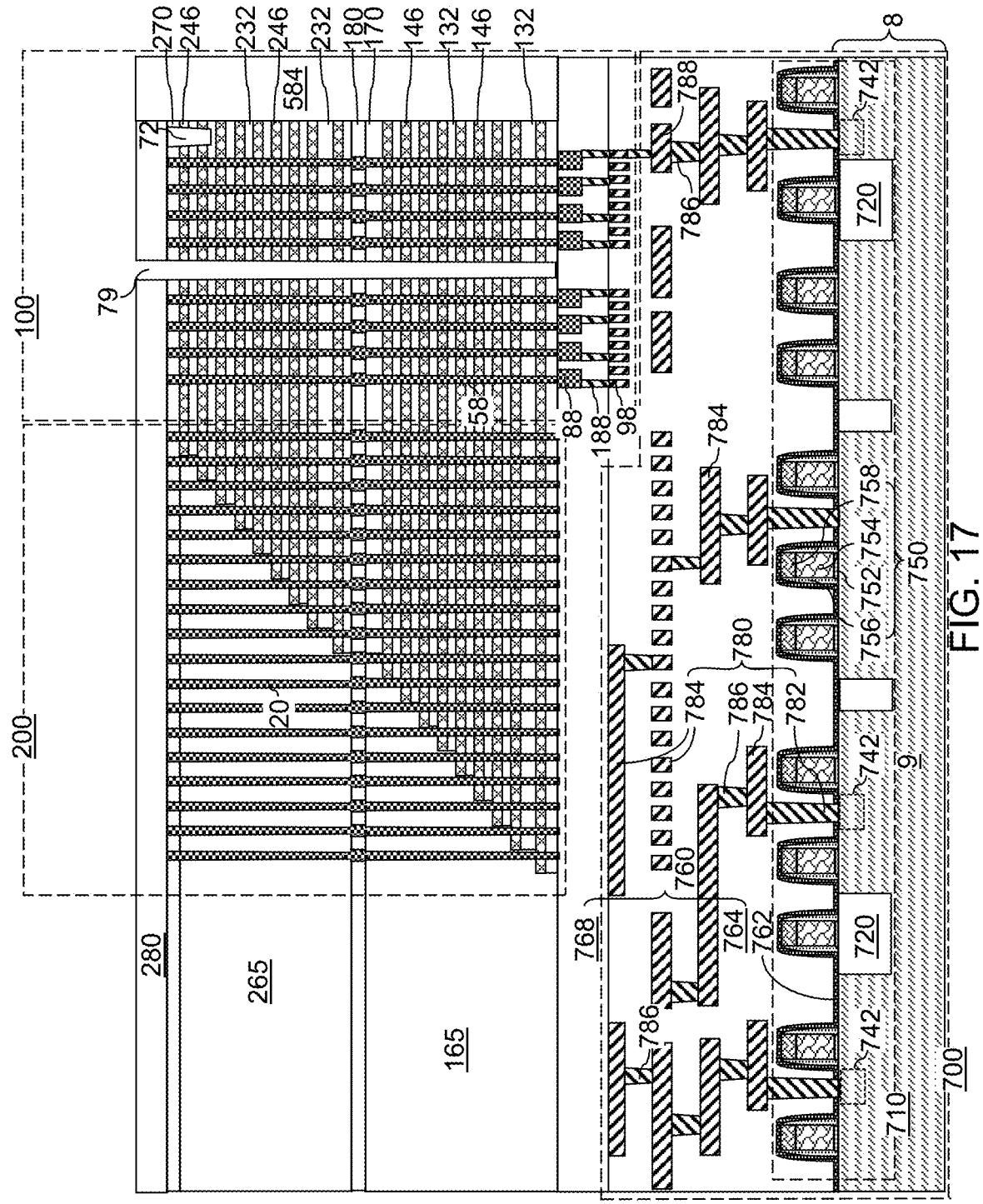
FIG. 17 is a vertical cross-sectional view of the exemplary structure after formation of electrically conductive layers according to an embodiment of the present disclosure.

Referring to FIG. 17, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 243, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. For example, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. For example, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

Each alternating stack {(132, 146), (232, 246)} comprises respective stepped surfaces in the staircase region 200. For example, the first alternating stack (132, 146) may include first stepped surfaces contacting the first retro-stepped dielectric material portion 165, and the second alternating stack (232, 246) may include second stepped surfaces contacting the second retro-stepped dielectric material portion 265. Each electrically conductive layer (146, 246) other than a topmost one of the electrically conductive layers 246 laterally extends farther than an overlying electrically conductive layer (146, 246). The electrically conductive layers (146, 246) comprise word lines for the vertical stacks of memory elements contained within the memory stack structures 55.

In some embodiment, source-select-level isolation structures 72 may be provided at topmost levels of the second electrically conductive layers 246. A subset of the second electrically conductive layers 246 located at the levels of the source-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 18A:
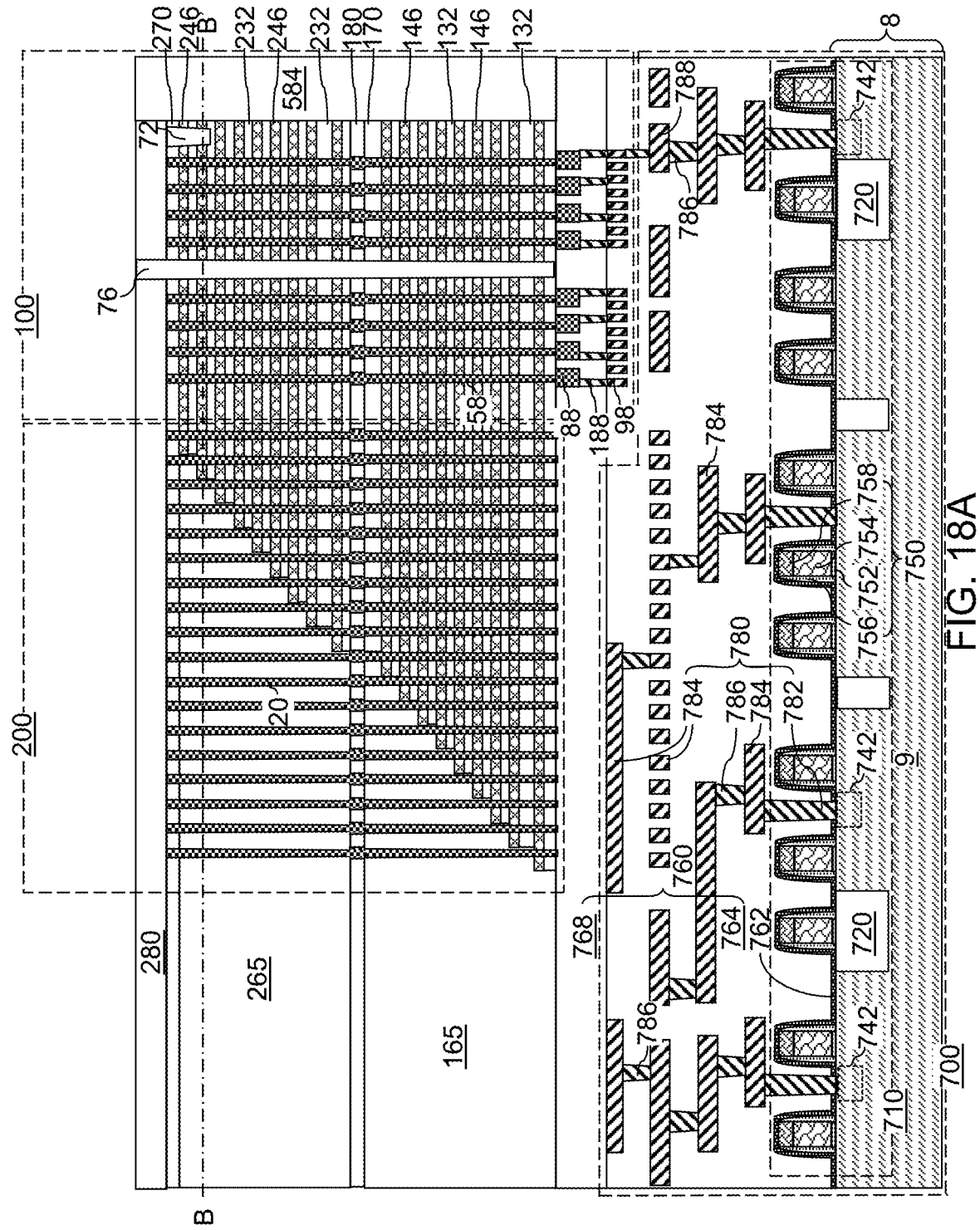
FIG. 18A is a vertical cross-sectional view of the exemplary structure after formation of insulating wall structures according to an embodiment of the present disclosure.
Figure 18B:
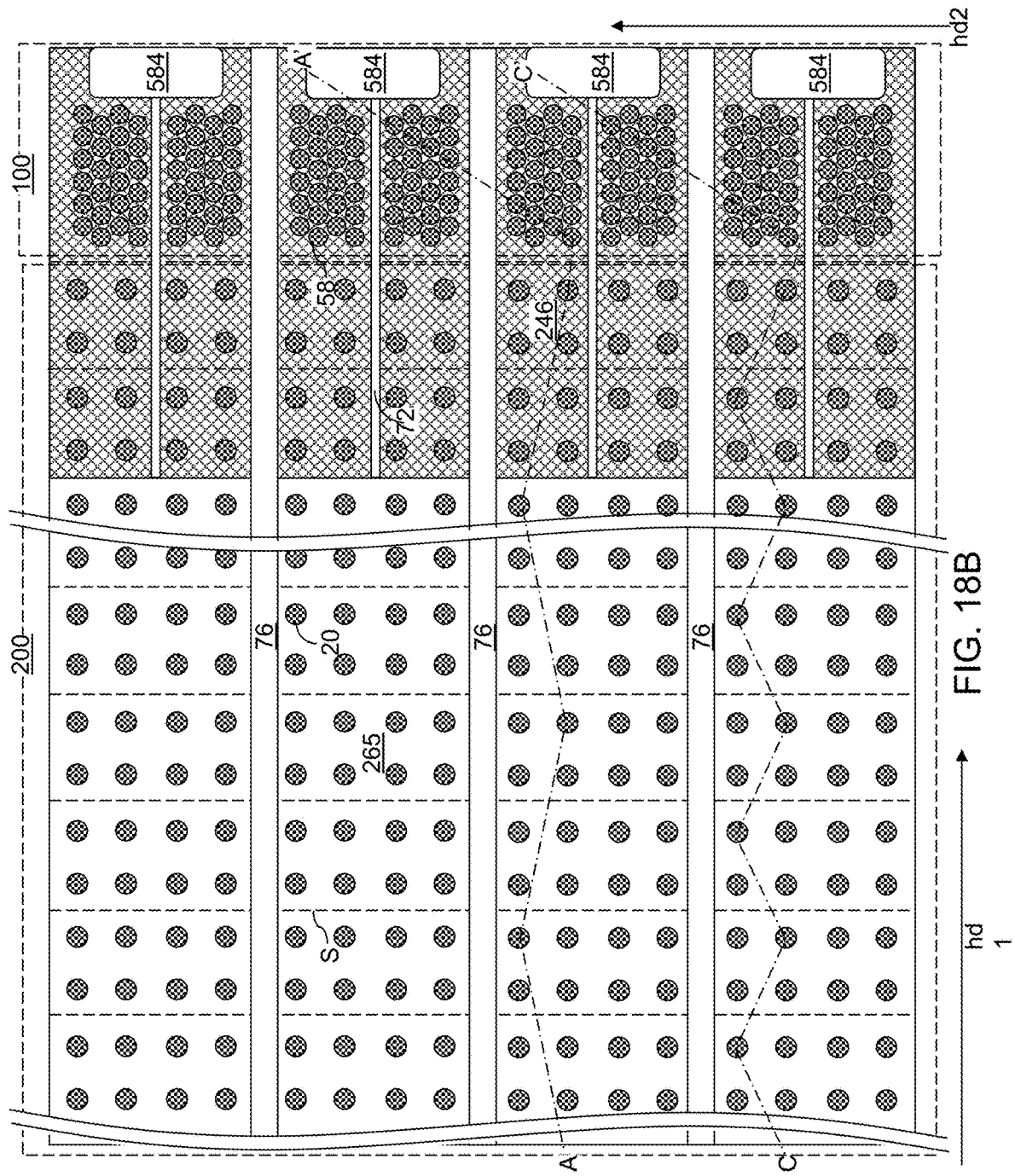
FIG. 18B is a horizontal cross-sectional of the exemplary structure along the horizontal plane B-B' of FIG. 18A. The hinged vertical plane A-A' corresponds to the plane of the vertical cross-sectional view of FIG. 18A.
Figure 18C:
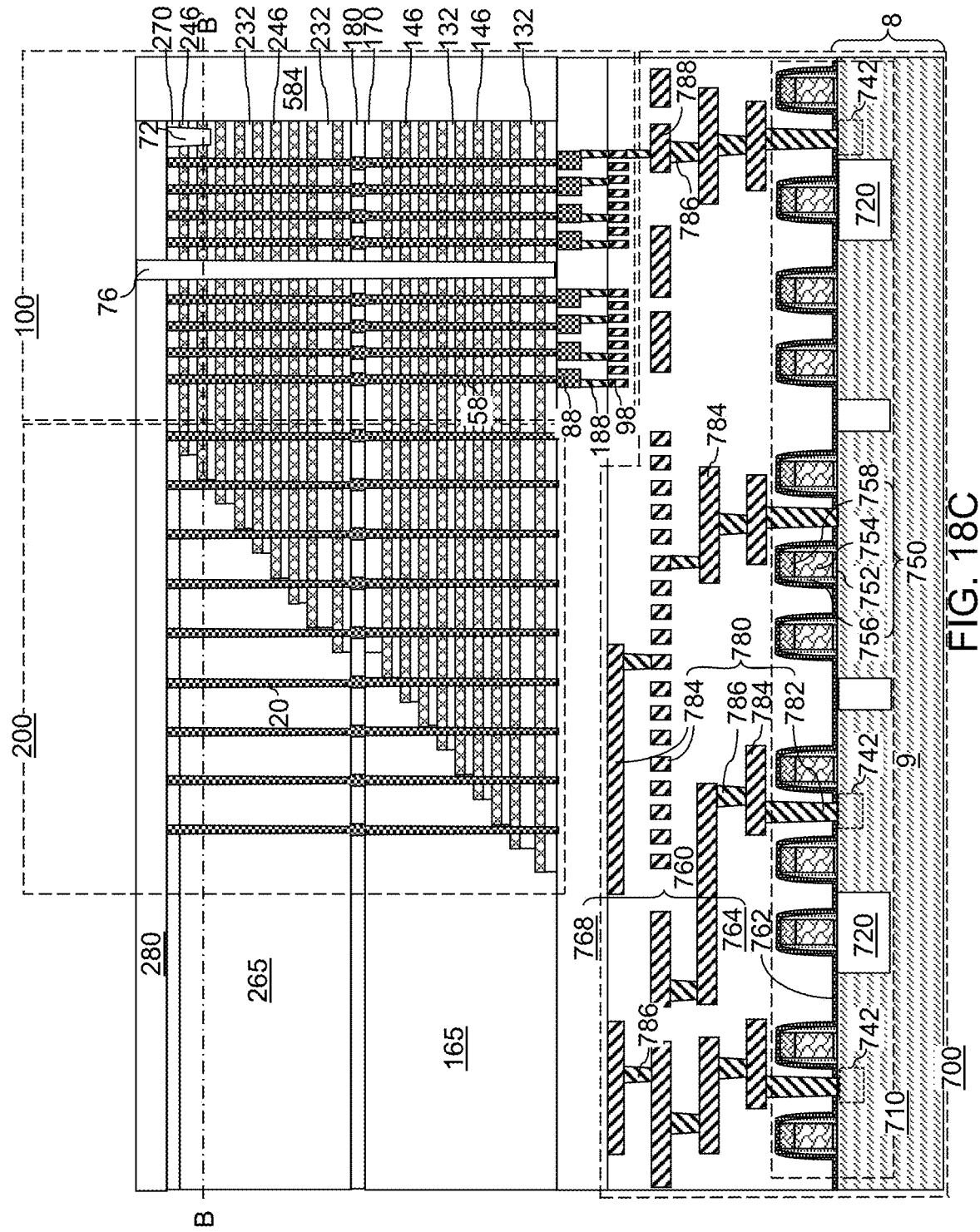
FIG. 18C is a vertical cross-sectional view of the exemplary structure along the vertical plane C-C' of FIG. 18B.

Referring to FIGS. 18A-18C, a dielectric material is deposited in the backside trenches 79 to form dielectric wall structures 76. Each of the dielectric wall structures 76 may laterally extend along the first horizontal direction hd1 and may vertically extend through each layer of an alternating stack of the insulating layers (132, 232) and the word-line-level electrically conductive layers 46. Each dielectric wall structure 76 may contact sidewalls of the first and second insulating cap layers (170, 270).

Figure 19A:
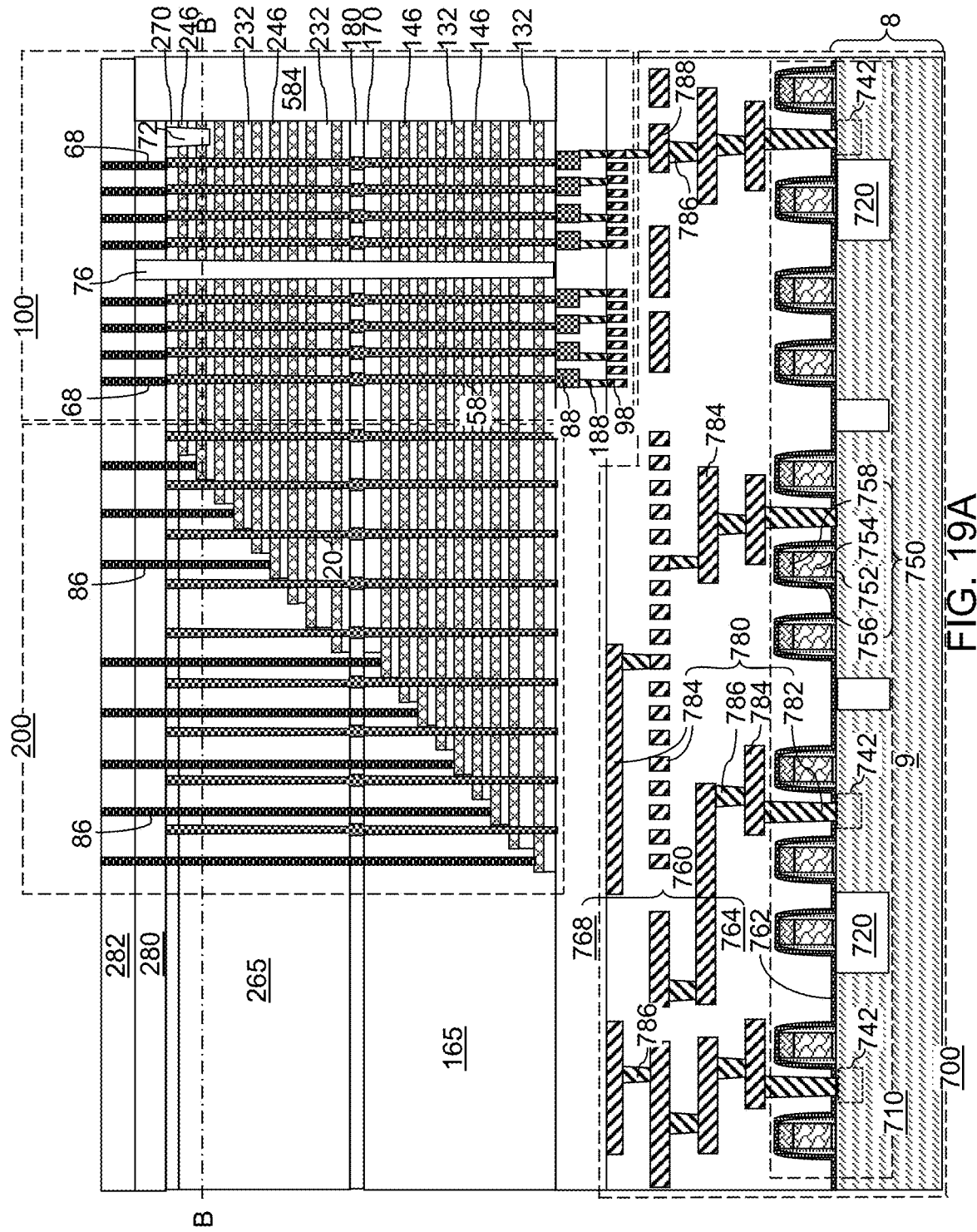
FIG. 19A is a vertical cross-sectional view of the exemplary structure after formation of various contact via structures according to an embodiment of the present disclosure.
Figure 19B:
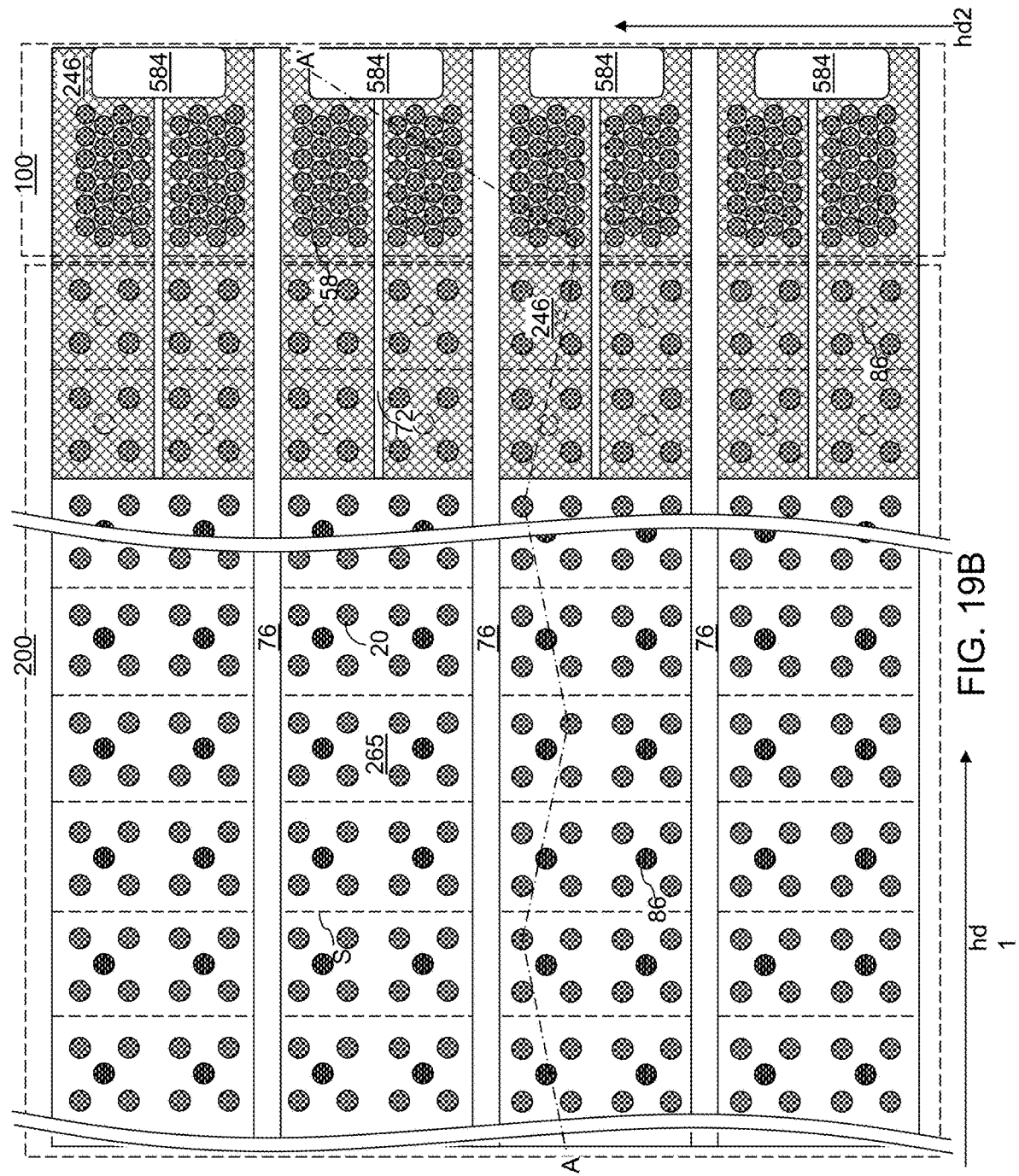
FIG. 19B is a horizontal cross-sectional view of the exemplary structure along the vertical plane B-B' of FIG. 19A. The hinged vertical plane A-A' corresponds to the plane of the vertical cross-sectional view of FIG. 19A.

Referring to FIGS. 19A and 19B, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming source contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The source regions 61 and the electrically conductive layers (146, 246) may be used as etch stop structures. Source contact via cavities may be formed over each source region 61, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Source contact via structures 68 are formed in the source contact via cavities and on a top surface of a respective one of the source regions 61. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 20A:
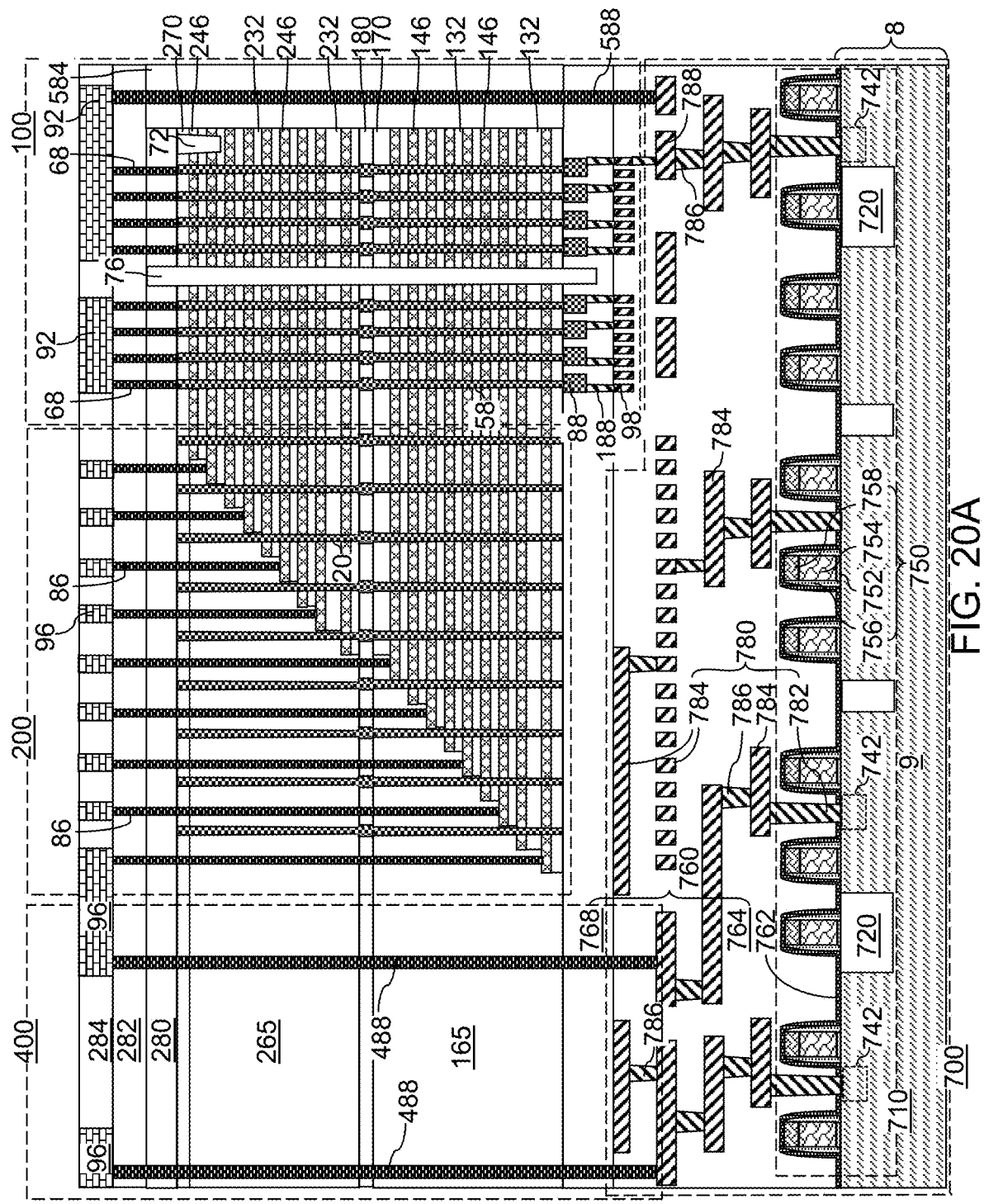
FIG. 20A is a vertical cross-sectional view of the exemplary structure after formation of through-memory-level via structures and upper-level metal interconnect structures according to an embodiment of the present disclosure.
Figure 20B:
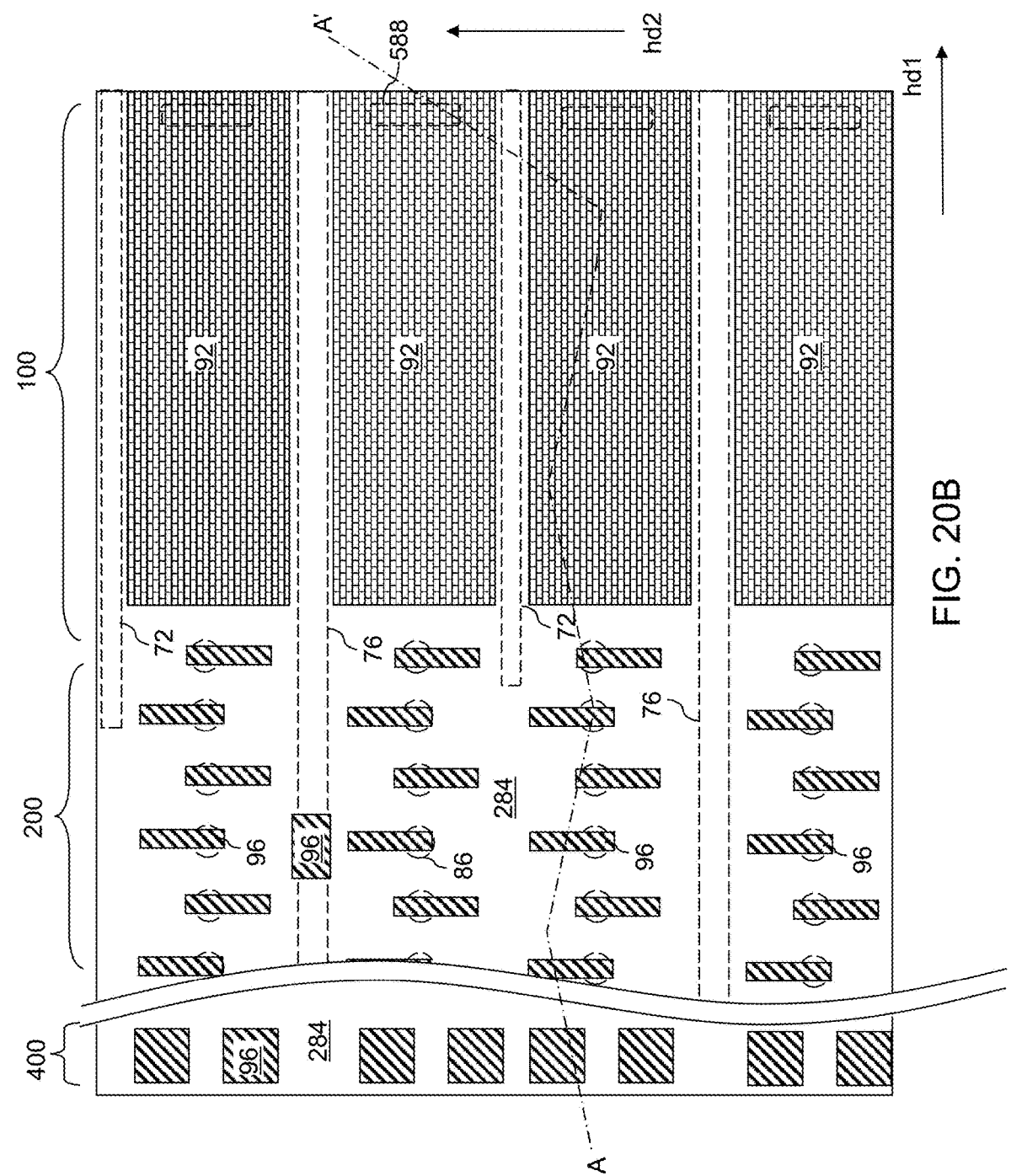
FIG. 20B is a horizontal cross-sectional view of the exemplary structure along the vertical plane B-B' of FIG. 20A. The hinged vertical plane A-A' corresponds to the plane of the vertical cross-sectional view of FIG. 20A.

Referring to FIGS. 20A and 20B, peripheral-region via cavities may be formed through the second and first contact level dielectric layers (282, 280), the second and first retro-stepped dielectric material portions (265, 165), and the drain-side dielectric layers 768 to top surfaces of a first subset of the lower-level metal interconnect structure 780 in the peripheral region 400. Source interconnect via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the source interconnect via cavities. Excess portions of the at least one conductive material may be removed from above the horizontal plane including the top surface of the second contact level dielectric layer 282. Each remaining portion of the at least one conductive material in a peripheral-region via cavity constitutes a peripheral-region contact via structure 488. Each remaining portion of the at least one conductive material in a source interconnect via cavity constitutes a source interconnect via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 284 that is formed over the contact level dielectric layers (280, 282). The upper-level metal interconnect structures may include source layers 92 contacting, or electrically connected to, a respective one of the source interconnect via structures 588 and a respective subset of the source contact via structures 68, and interconnection line structures 96 contacting, and/or electrically connected to, at least one of the staircase-region contact via structures 86 and/or the peripheral-region contact via structures 488. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Each source interconnect via structure 588 vertically extends from a lower-level metal interconnect structure 780 formed within the lower-interconnect-level dielectric material layers 764 to a horizontal plane including top surfaces of the source contact via structures 68. Each source layer 92 overlies the alternating stacks {(132, 146), (232, 246)}. Each source layer 92 is electrically connected to an upper end of each vertical semiconductor channel within a subset of the vertical semiconductor channels 60 that underlies the source layer 92. In one embodiment, each subset of the memory opening fill structures 58 may be located between a neighboring pair of backside trenches 79. In another embodiment, each subset of the memory opening fill structures 58 may be located between a neighboring pair of a backside trench 79 and a source-select-level isolation structure 72 or between a neighboring pair of source-select-level isolation structures 72.

Figure 21:
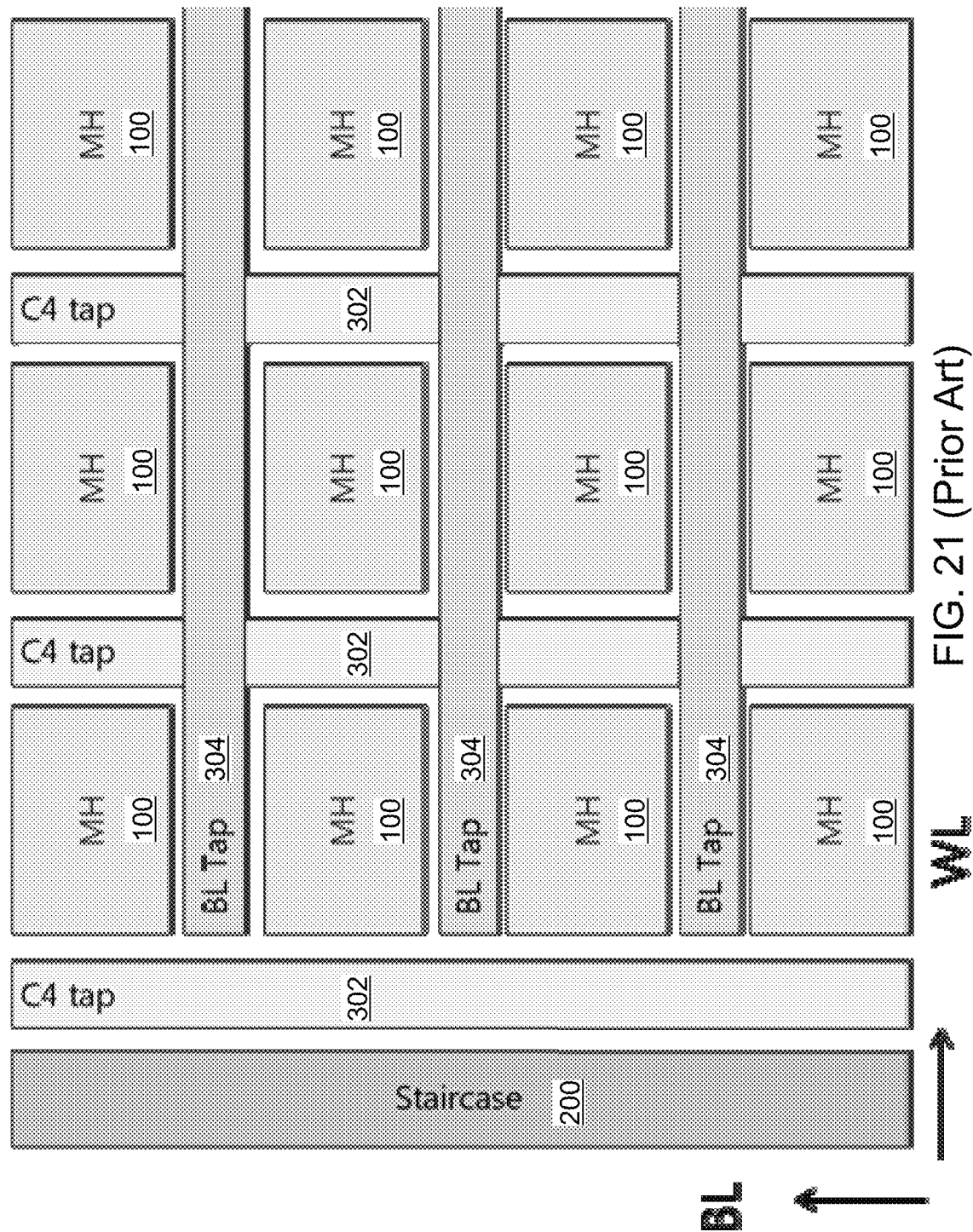
FIG. 21 is a layout of a prior art three-dimensional memory device using bit line tap regions to provide vertical interconnections through the level of a three-dimensional memory device.

FIG. 21 is a layout of a prior art three-dimensional memory device using power supply connection (C4 tap) regions 302 and bit line tap (BL tap) regions 304 to provide vertical interconnections through the level of a three-dimensional memory device. Each of the C4 tap regions 302 and the BL tap regions 304 may include a respective dielectric pillar or dielectric filled trench structure and at least one vertical interconnection via structure that vertically extends through the entire thickness range of a three-dimensional memory array within the prior at three-dimensional memory device. For example, the BL tap regions 304 may comprise a large dielectric filled trench extending in the word line direction and vertical interconnection via structure connecting bit lines which overly the prior art memory array region 100 and driver circuit devices 710 located under the memory array region 100. Each "MH" represents a memory array region 100 and "Staircase" represents staircase region 200. Direction "WL" represents the word line direction (e.g., the first horizontal direction hd1). Direction "BL" represents the bit line direction (e.g., the second horizontal direction hd2). The BL tap regions are provided because each bit line in the prior art three-dimensional memory device needs to be individually connected to a respective node of a bit line driver circuitry through the entire thickness range of a three-dimensional memory array within the prior at three-dimensional memory device.

Figure 22:
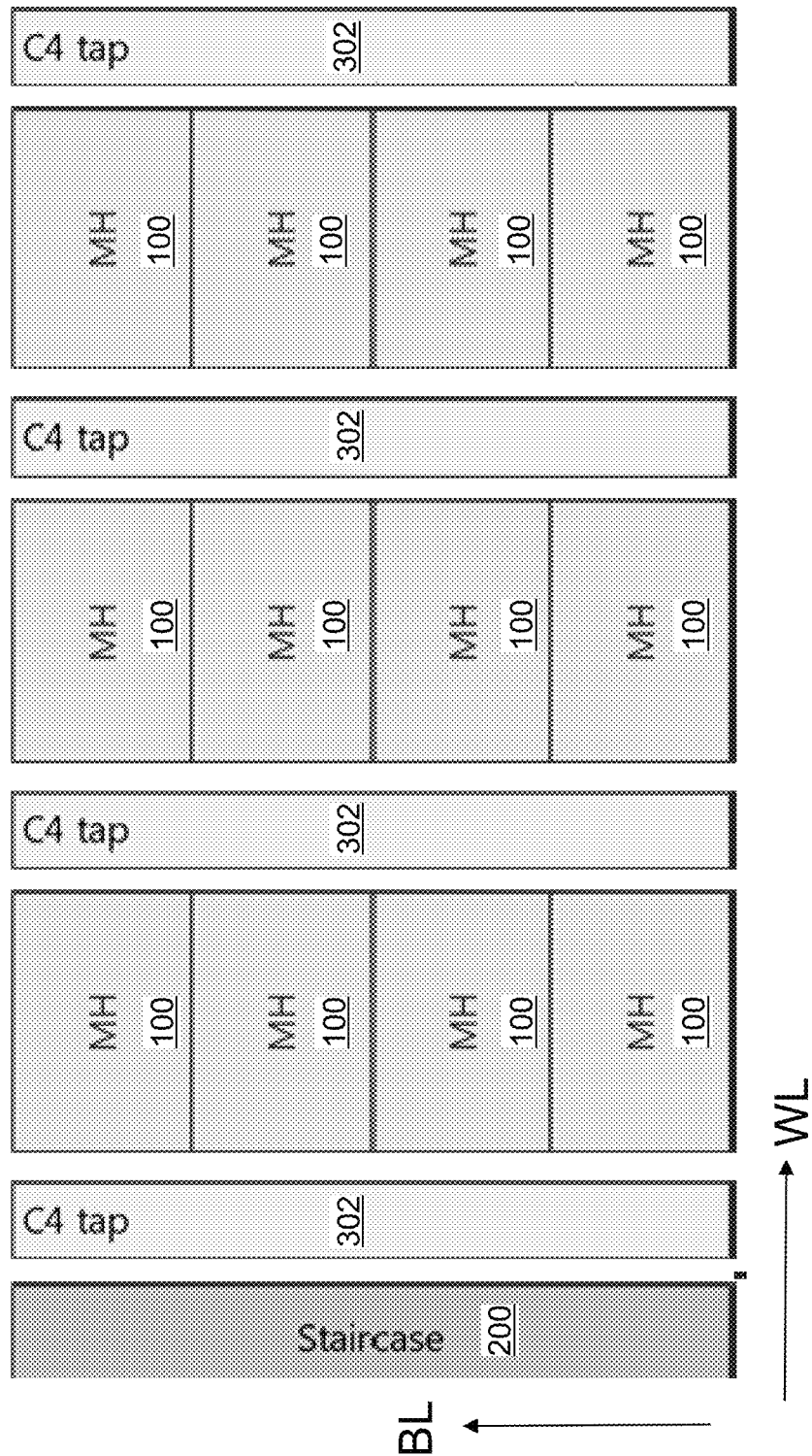
FIG. 22 is a layout for the three-dimensional memory device of the present disclosure, which does not require areas for bit line tap regions.

FIG. 22 is a layout for the three-dimensional memory device of an embodiment of the present disclosure, which does not require areas for bit line tap regions 304. This is because the bit lines 98 are provided below the three-dimensional memory array in the memory array region 100 of the embodiments of the present disclosure. Thus, vertical wiring for bit lines 98 through the level of the three-dimensional memory array may be eliminated in the three-dimensional memory device of the present disclosure. The area of the C4 tap regions 302 may be used to form interconnection region dielectric fill material portions 584 and source interconnect via structures 588 to connect the source lines 92 with the driver circuit devices 710 in addition to various power supply connections to the driver circuit devices 710 in the three-dimensional memory device of the embodiments of the present disclosure. The layout for the three-dimensional memory device of the embodiments of the present disclosure may be smaller than the prior art layout of FIG. 21 and/or may contain more space for the memory array regions 100 through elimination of areas for the BL tap regions 304 of the layout of FIG. 21.

Figure 23:
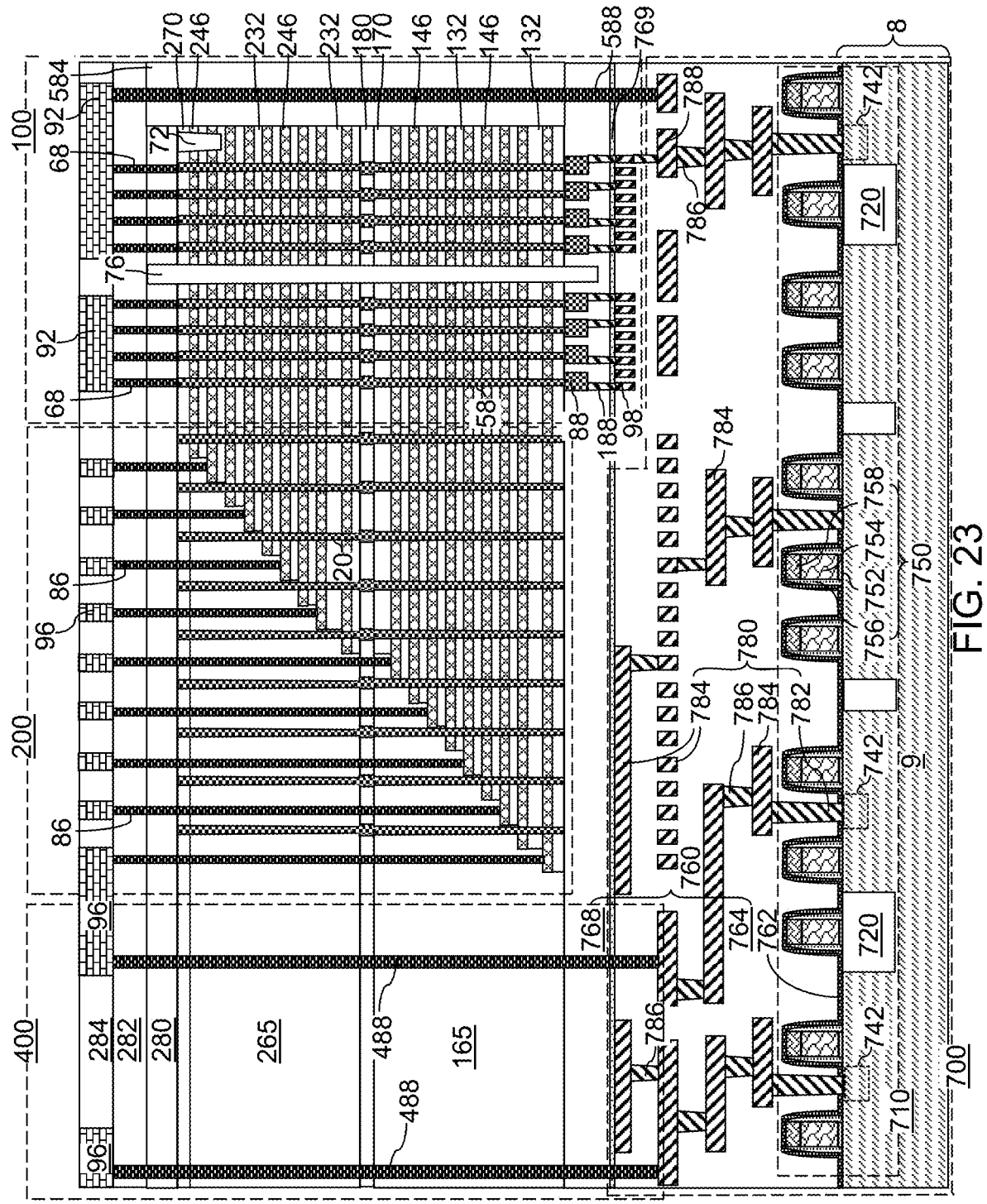
FIG. 23 is a vertical cross-sectional view of an alternative embodiment of the exemplary structure.

Referring to FIG. 23, an alternative embodiment of the exemplary structure of the present disclosure is illustrated, which can be derived from the exemplary structure described above by forming an etch stop layer 769 on the physically exposed top surfaces of the lower-interconnect-level dielectric material layers 764, the lower-level metal line structures 784, and the bit lines 98 after the processing steps of FIGS. 1A and 1B. In one embodiment, the etch stop layer 769 can be formed after formation of the bit line material layer 98L and prior to formation of the at least one pattern transfer material layer 771L illustrated in FIG. 1C. The etch stop layer 769 includes a dielectric material that can function as an etch stop material during subsequent anisotropic etch processes. The etch stop layer 769 can be employed to effectively increase the etch selectivity of anisotropic etch processes that are employed to form various patterns that extend to the top surface of the bit line material layer 98L or to the top surfaces of the bit lines 98. In one embodiment, the etch stop layer 769 can include silicon nitride or a dielectric metal oxide material such as aluminum oxide, hafnium oxide, and/or titanium oxide. The thickness of the etch stop layer 769 can be in a range from 5 nm to 30 nm, such as from 10 nm to 20 nm, although lesser and greater thicknesses can also be employed. In case the etch stop layer 769 is included, each anisotropic etch process that etches cavities that extend to the bit lines 98 can be modified to include a first etch step that stops on the etch stop layer 769 and a second etch step that etches through the etch stop layer 769. Further, etch steps that form the cavities for forming the peripheral-region contact via structure 488 and/or the source interconnect via structure 588 can be appropriately modified to etch through the etch stop layer 769. In one embodiment, the thickness of the etch stop layer 769 can be minimized to reduce parasitic capacitance among the bit lines 98 and between the bit lines 98 and adjacent conductive structures as long as the etch stop layer 769 provides the function of an etch stopper material.

Referring to all drawings and according to various embodiments of the present disclosure, a three-dimensional semiconductor device is provided, which comprises: bit lines 98 formed in the lower-interconnect-level dielectric material layers 764, laterally spaced apart along a first horizontal direction hd1, and laterally extending a long a second horizontal direction hd2 that is perpendicular to the first horizontal direction hd1, and located over a top surface of a substrate 8; bit-line-connection via structures 188 contacting a top surface of a respective one of the bit lines 98 and formed in a via-level dielectric layer 768A; pillar-shaped drain regions 88 contacting a respective one of the bit-line-connection via structures 188; an alternating stack of insulating layers (132 and/or 232) and electrically conductive layers (146 and/or 246) located over the pillar-shaped drain regions 88; memory opening fill structures 58 vertically extending through the alternating stack {(132, 146), (232, 246)} and including a respective memory stack structure 55 that contains a respective vertical semiconductor channel 60 and a respective vertical stack of memory elements (for example, comprising portions of a charge storage layer 54 located at levels of the electrically conductive layers (146, 246)); and a source layer 92 overlying the alternating stack {(132, 146), (232, 246)} and electrically connected to an upper end of each vertical semiconductor channel 60 within a subset of the vertical semiconductor channels 60. Field effect transistors (as a subset of the semiconductor devices 710) are located on or over a top surface of the substrate 8, such that the bit lines 98 are located between the field effect transistors and the memory opening fill structures 58.

In one embodiment, the three-dimensional memory device comprises: lower-level metal interconnect structures 780 located above, and electrically connected to, the field effect transistors, formed within the lower-interconnect-level dielectric material layers 164, and underlies the alternating stack {(132, 146), (232, 246)}.

In one embodiment, the bit lines 98 are electrically connected to a subset of the field effect transistors that comprises bit line drivers through a subset of the lower-level metal interconnect structures 780.

In one embodiment, each memory stack structure 55 comprises a vertical NAND string; and each vertical stack of memory elements comprises a vertical stack of charge storage elements located at levels of the electrically conductive layers (146, 246).

In one embodiment, the bit-line-connection via structures 188 are elongated along the second horizontal direction hd2 with a length-to-width ratio in a range from 1.5 to 10.

In one embodiment, each of the pillar-shaped drain regions 88 contacts an entire top surface of an underlying one of the bit-line-connection via structures 188 and has a greater horizontal cross-sectional area than a horizontal cross-sectional area of the underlying one of the bit-line-connection via structures 188.

In one embodiment, the pillar-shaped drain regions 88 comprise a doped semiconductor material including dopant atoms at an atomic concentration in a range from $5.0\times10^{19}/cm^3$ to $2.0\times10^{21}/cm^3$; and the pillar-shaped drain regions 88 have a circular cylindrical shape or have a lesser length-to-width ratio than the bit-line-connection via structures 188.

In one embodiment, the three-dimensional memory device comprises: source contact via structures 68 contacting an upper end of a respective one of the vertical semiconductor channels 60 and contacting a bottom surface of the source layer 92; and a source interconnect via structure 588 that electrically connects the source layer 92 to a lower-level metal interconnect structure 780 formed within the lower-interconnect-level dielectric material layers 764.

In one embodiment, the alternating stack {(132, 146), (232, 246)} comprises stepped surfaces in a staircase region 200, wherein each electrically conductive layer (146, 246) other than a topmost one of the electrically conductive layers 246 laterally extends farther than an overlying electrically conductive layer (146, 246); the electrically conductive layers (146, 246) comprise word lines for the vertical stacks of memory elements; and word line contact via structures (comprising a subset of the staircase-region contact via structures 86) contact a respective one of the electrically conductive layers (146, 246).

In one embodiment, the three-dimensional memory device comprises a word line driver circuit (comprising a subset of the semiconductor devices 710) located on a top surface of the substrate 8 and underlies the alternating stack {(132, 146), (232, 246)}, wherein the word line contact via structures are electrically connected to the word line driver circuit through lower-level metal interconnect structures 780 formed within the lower-interconnect-level dielectric material layers 764.

In one embodiment, the three-dimensional memory device comprises inter-bit-line cavities 767 located between neighboring pairs of bit lines 98 and laterally extending along the second horizontal direction hd2, wherein each of the inter-bit-line cavities 767 is vertically bounded by a curved bottom surface portion of the via-level dielectric layer 768A.

In one embodiment, the three-dimensional memory device comprises a dielectric etch stop layer 769 located between the pillar-shaped drain regions 88 and the bit lines and a bit-line dielectric liner 765 that conformally covers sidewalls and top surfaces of the bit lines 98. The via-level dielectric layer 768A comprises a material selected from undoped silicate glass, a doped silicate glass, non-porous organosilicate glass, and porous organosilicate glass; and the bit-line dielectric liner 765 comprises a material selected from silicon nitride, silicon oxynitride, a dielectric metal oxide material, and nitrogen-doped organosilicate glass.

Various embodiments provided herein disclose semiconductor memory devices having bit lines formed in lower-interconnect-level dielectric material layers under a memory hole array. Various embodiments disclose bit lines that may be formed between memory elements and an underlying peripheral circuit. By providing bit lines in lower-interconnect-level dielectric material layers under a memory hole array, cell source lines may be formed on top of memory holes. In such embodiments, the process to connect cell source lines to memory holes is significantly eased. Thus, the overall formation and connection process is easier and the overall yield may be improved. Bit line performance may also be improved due to improved resistance characteristics.

Furthermore, typically, vertical semiconductor channels of the memory stack structures are electrically connected to a source line that underlies the alternating stack. In that case, a lot of long contact vias are needed to supply power to the source line. However, in the embodiments of the present invention, such long contact vias are not needed. As a result, chip area is reduced.

Moreover, by forming bit lines under the cell array, the bit line tap area of conventional devices is not needed. The bit lines may be directly connected with bit line switching transistors. The impact of the bit line tap area in conventional devices is large. Thus, the various embodiments provide for more efficient use of space by reducing the die size.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   bit lines formed in a lower-interconnect-level dielectric material layers, laterally spaced apart along a first horizontal direction, and laterally extending a long a second horizontal direction that is perpendicular to the first horizontal direction, and located over a top surface of a substrate;
   bit-line-connection via structures contacting a top surface of a respective one of the bit lines and formed in a via-level dielectric layer;
   pillar-shaped drain regions contacting a respective one of the bit-line-connection via structures;
   an alternating stack of insulating layers and electrically conductive layers located over the pillar-shaped drain regions;
   memory opening fill structures vertically extending through the alternating stack and including a respective memory stack structure that contains a respective vertical semiconductor channel and a respective vertical stack of memory elements;
   a source layer overlying the alternating stack and electrically connected to an upper end of each vertical semiconductor channel within a subset of the vertical semiconductor channels; and
   field effect transistors located on or over the top surface of the substrate, wherein the bit lines are located between the field effect transistors and the memory opening fill structures.

2. The three-dimensional memory device of claim 1, further comprising lower-level metal interconnect structures located above, and electrically connected to, the field effect transistors, formed within the lower-interconnect-level dielectric material layers, and underlying the alternating stack.

3. The three-dimensional memory device of claim 2, wherein the bit lines are electrically connected to a subset of the field effect transistors that comprise bit line drivers through a subset of the lower-level metal interconnect structures.

4. The three-dimensional memory device of claim 1, wherein:
   each memory stack structure comprises a vertical NAND string; and
   each vertical stack of memory elements comprises a vertical stack of charge storage elements located at levels of the electrically conductive layers.

5. The three-dimensional memory device of claim 1, wherein the bit-line-connection via structures are elongated along the second horizontal direction with a length-to-width ratio in a range from 1.5 to 10.

6. The three-dimensional memory device of claim 1, wherein each of the pillar-shaped drain regions contacts an entire top surface of an underlying one of the bit-line-connection via structures and has a greater horizontal cross-sectional area than a horizontal cross-sectional area of the underlying one of the bit-line-connection via structures.

7. The three-dimensional memory device of claim 6, wherein:
the pillar-shaped drain regions comprise a doped semiconductor material including dopant atoms at an atomic concentration in a range from $5.0 \times 10^{19}/cm^3$ to $2.0 \times 10^{21}/cm^3$; and
the pillar-shaped drain regions have a circular cylindrical shape or have a lesser length-to-width ratio than the bit-line-connection via structures.

8. The three-dimensional memory device of claim 1, further comprising:
source contact via structures contacting an upper end of a respective one of the vertical semiconductor channels and contacting a bottom surface of the source layer; and
a source interconnect via structure that electrically connects the source layer to a lower-level metal interconnect structure formed within the lower-interconnect-level dielectric material layers.

9. The three-dimensional memory device of claim 1, wherein:
the alternating stack comprises stepped surfaces in a staircase region, wherein each electrically conductive layer other than a topmost one of the electrically conductive layers laterally extends farther than an overlying electrically conductive layer;
the electrically conductive layers comprise word lines for the vertical stacks of memory elements; and
word line contact via structures contact a respective one of the electrically conductive layers.

10. The three-dimensional memory device of claim 9, further comprising a word line driver circuit located on a top surface of the substrate and underlies the alternating stack, wherein the word line contact via structures are electrically connected to the word line driver circuit through lower-level metal interconnect structures formed within the lower-interconnect-level dielectric material layers.

11. The three-dimensional memory device of claim 1, further comprising inter-bit-line cavities located between neighboring pairs of bit lines and laterally extending along the second horizontal direction, wherein each of the inter-bit-line cavities is vertically bounded by a curved bottom surface portion of the via-level dielectric layer.

12. The three-dimensional memory device of claim 11, further comprising:
a dielectric etch stop layer located between the pillar-shaped drain regions and the bit lines; and
a bit-line dielectric liner that conformally covers sidewalls and top surfaces of the bit lines,
wherein:
the via-level dielectric layer comprises a material selected from undoped silicate glass, a doped silicate glass, non-porous organosilicate glass, and porous organosilicate glass; and
the bit-line dielectric liner comprises a material selected from silicon nitride, silicon oxynitride, a dielectric metal oxide material, and nitrogen-doped organosilicate glass.

\* \* \* \* \*